(12) United States Patent
Joe et al.

(10) Patent No.: US 10,714,387 B2
(45) Date of Patent: Jul. 14, 2020

(54) INTEGRATED CIRCUIT DEVICES AND METHOD OF MANUFACTURING THE SAME

(71) Applicant: Samsung Electronics Co., Ltd., Suwon-si, Gyeonggi-do (KR)

(72) Inventors: Jin-yeong Joe, Suwon-si (KR); Seok-hoon Kim, Suwon-si (KR); Jeong-ho Yoo, Seongnam-si (KR); Seung-hun Lee, Hwaseong-si (KR); Geun-hee Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/275,942

(22) Filed: Feb. 14, 2019

(65) Prior Publication Data

US 2019/0363009 A1  Nov. 28, 2019

(30) Foreign Application Priority Data

May 23, 2018  (KR) .......................... 10-2018-0058640

(51) Int. Cl.
*H01L 21/768* (2006.01)
*H01L 23/528* (2006.01)

(52) U.S. Cl.
CPC ...... *H01L 21/76877* (2013.01); *H01L 23/528* (2013.01)

(58) Field of Classification Search
CPC .............. H01L 23/528; H01L 23/4821; H01L 27/10826; H01L 27/10879; H01L 27/1211; H01L 27/0886; H01L 27/0924; H01L 29/41791; H01L 29/66795; H01L 29/785; H01L 29/4991; H01L 29/0649
See application file for complete search history.

(56) References Cited

U.S. PATENT DOCUMENTS

| | | | |
|---|---|---|---|
| 8,466,018 B2 | 6/2013 | Illgen et al. | |
| 8,809,953 B2 | 8/2014 | Fried et al. | |
| 9,449,975 B1 | 9/2016 | Ching et al. | |
| 9,543,387 B2 | 1/2017 | Chang et al. | |
| 2002/0071087 A1* | 6/2002 | Suzuki | G02F 1/1345 349/155 |
| 2008/0124875 A1* | 5/2008 | Liao | H01L 21/266 438/285 |
| 2016/0049511 A1 | 2/2016 | Kim et al. | |
| 2016/0211371 A1 | 7/2016 | Tsai et al. | |
| 2017/0302066 A1 | 10/2017 | Gao et al. | |

\* cited by examiner

*Primary Examiner* — Chuong A Luu
(74) *Attorney, Agent, or Firm* — Harness, Dickey & Pierce, P.L.C.

(57) ABSTRACT

An integrated circuit device includes a fin-type active region extending on a substrate in a first direction parallel to a top surface of the substrate; a gate structure extending on the fin-type active region and extending in a second direction parallel to the top surface of the substrate and different from the first direction; and source/drain regions in a recess region extending from one side of the gate structure into the fin-type active region, the source/drain regions including an upper semiconductor layer on an inner wall of the recess region, having a first impurity concentration, and including a gap; and a gap-fill semiconductor layer, which fills the gap and has a second impurity concentration that is greater than the first impurity concentration.

20 Claims, 33 Drawing Sheets

INTEGRATED CIRCUIT DEVICES AND METHOD OF MANUFACTURING THE SAME

CROSS-REFERENCE TO RELATED APPLICATION

This application claims the benefit of Korean Patent Application No. 10-2018-0058640, filed on May 23, 2018, in the Korean Intellectual Property Office, the disclosure of which is incorporated herein in its entirety by reference.

BACKGROUND

The inventive concepts relate to an integrated circuit device and a method of manufacturing the same, and more particularly, to an integrated circuit device including a fin-type active region and a method of manufacturing the same.

There is a growing demand for higher integration of integrated circuit devices in accordance with the reduction and/or miniaturization of electronic products. A short channel effect of a transistor occurs due to downscaling of integrated circuit devices, thereby deteriorating the reliability of the integrated circuit devices. To reduce the short channel effect, an integrated circuit device including a fin-type active region has been proposed. However, as the design rule is reduced, the sizes of the fin-type active region, a gate line, and source/drain regions are also reduced.

SUMMARY

The inventive concepts provide an integrated circuit device with reduced size and/or improved electrical performance.

The inventive concepts provide a method of manufacturing an integrated circuit device with reduced size and/or improved electrical performance.

According to an aspect of the inventive concepts, there is provided an integrated circuit device including a fin-type active region extending on a substrate in a first direction parallel to a top surface of the substrate; a gate structure extending on the fin-type active region and extending in a second direction parallel to the top surface of the substrate and different from the first direction; and source/drain regions in a recess region extending from one side of the gate structure into the fin-type active region, the source/drain regions including an upper semiconductor layer on an inner wall of the recess region, having a first impurity concentration, the upper semiconductor layer including a gap; and a gap-fill semiconductor layer, in the gap having a second impurity concentration greater than the first impurity concentration.

According to another aspect of the inventive concepts, there is provided an integrated circuit device including a fin-type active region extending on a substrate in a first direction parallel to a top surface of the substrate; first and second gate structures extending on the fin-type active region and extending in a second direction parallel to the top surface of the substrate and different from the first direction; and source/drain regions in a recess region extending into the fin-type active region between the first and second gate structure, the source/drain regions including an upper semiconductor layer on an inner wall of the recess region, having a first impurity concentration, the upper semiconductor layer including a gap extending in a third direction perpendicular to a top surface of the substrate; a gap-fill semiconductor layer, in the gap having a second impurity concentration greater than the first impurity concentration.

According to another aspect of the inventive concepts, there is provided an integrated circuit device including a fin-type active region extending on a substrate in a first direction parallel to a top surface of the substrate; a plurality of gate structures extending on the fin-type active region and extending in a second direction parallel to the top surface of the substrate and different from the first direction; and source/drain regions in a recess region extending into the fin-type active region between two gate structure adjacent to each other, the source/drain regions including an upper semiconductor layer on an inner wall of the recess region, the upper semiconductor layer including a gap, and a gap-fill semiconductor layer in the gap, wherein a top surface of the gap-fill semiconductor layer is covered by the upper semiconductor layer.

According to another aspect of the inventive concepts, there is provided a method of manufacturing an integrated circuit device, the method including forming a fin-type active region extending in a first direction on a substrate; removing a portion of the fin-type active region to form a recess region extending into the fin-type active region; forming an upper semiconductor layer, which includes a gap and is doped with a first impurity at a first impurity concentration, on an inner wall of the recess region; and forming a gap-fill semiconductor layer, which fills the gap and is doped with the first impurity at a second impurity concentration higher than the first impurity concentration, on the upper semiconductor layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Hereinafter, example embodiments of the inventive concepts will be described in detail with reference to the accompanying drawings.

Figure 1:
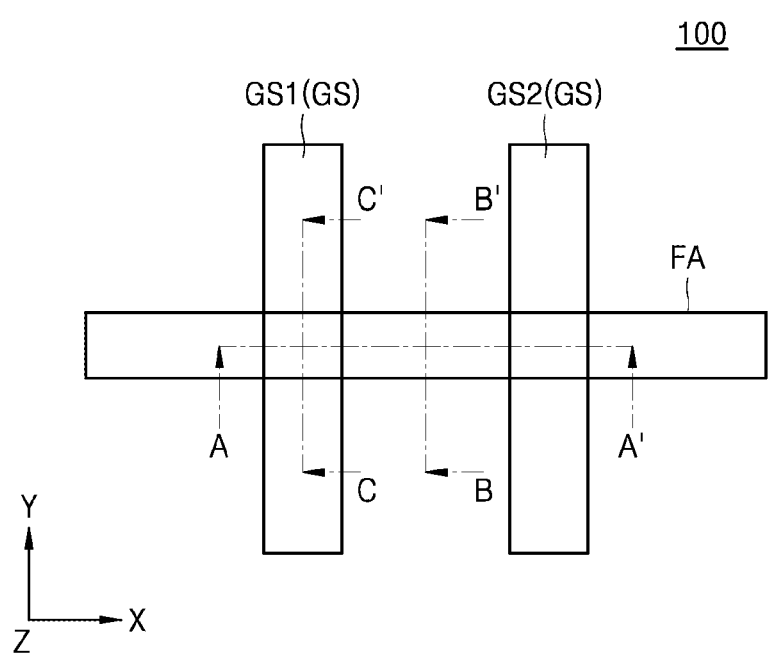
FIG. 1 is a layout diagram showing an integrated circuit device according to example embodiments.
Figure 2:
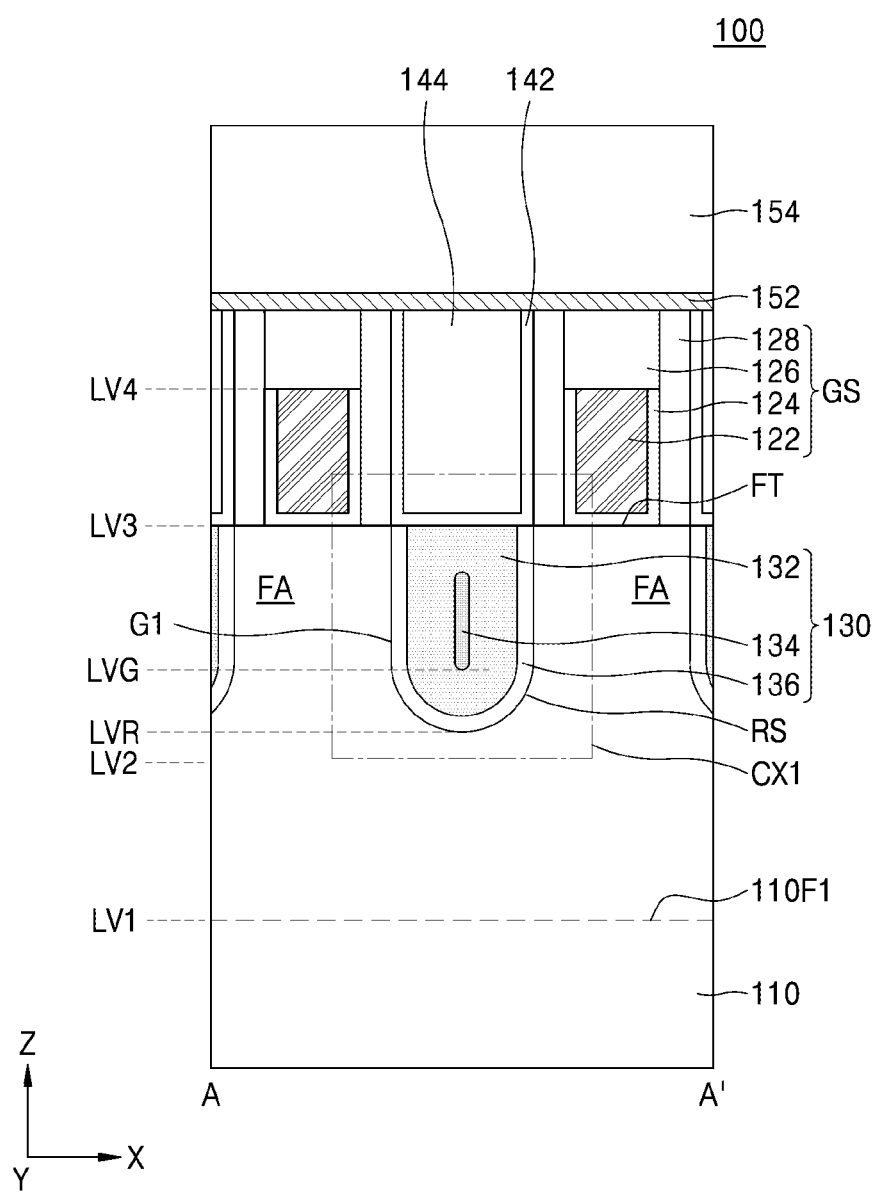
FIG. 2 is a cross-sectional view taken along a line A-A' in FIG. 1.
Figure 3:
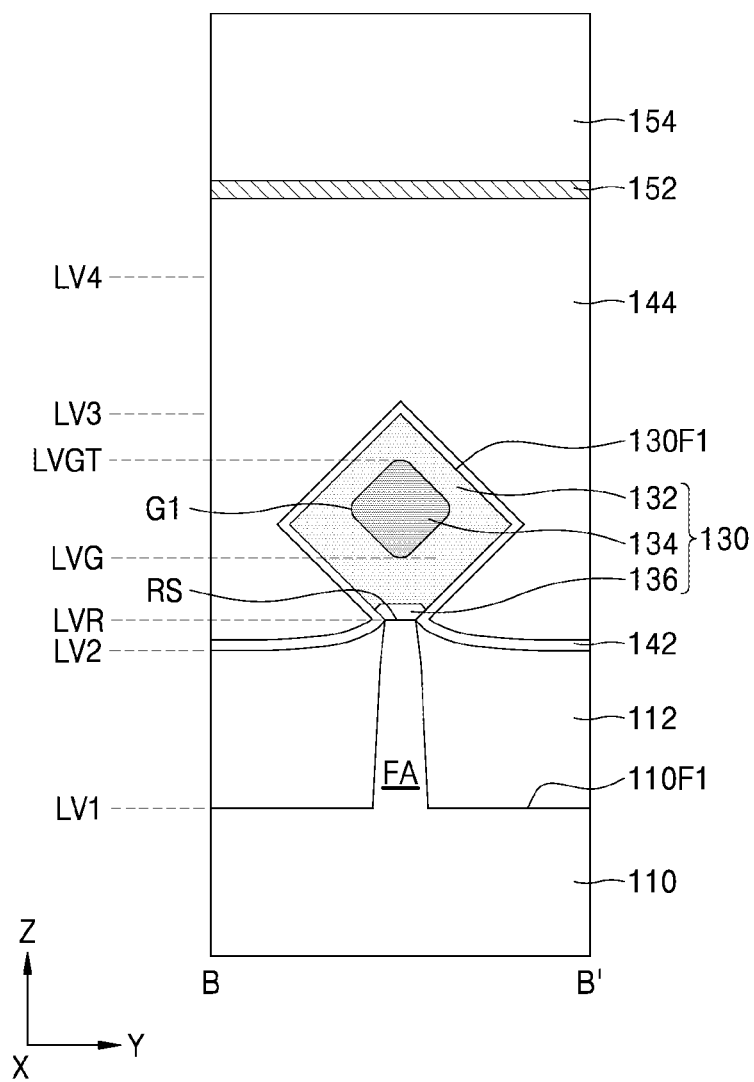
FIG. 3 is a cross-sectional view taken along a line B-B' in FIG. 1.
Figure 4:
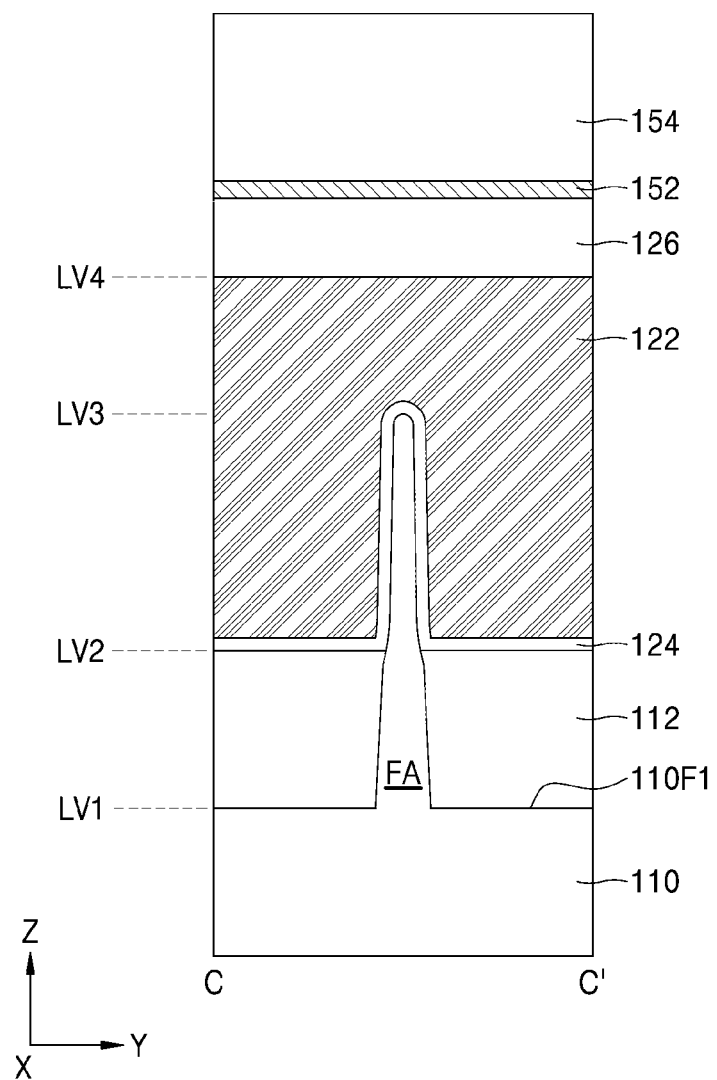
FIG. 4 is a cross-sectional view taken along a line C-C' in FIG. 1.
Figure 5:
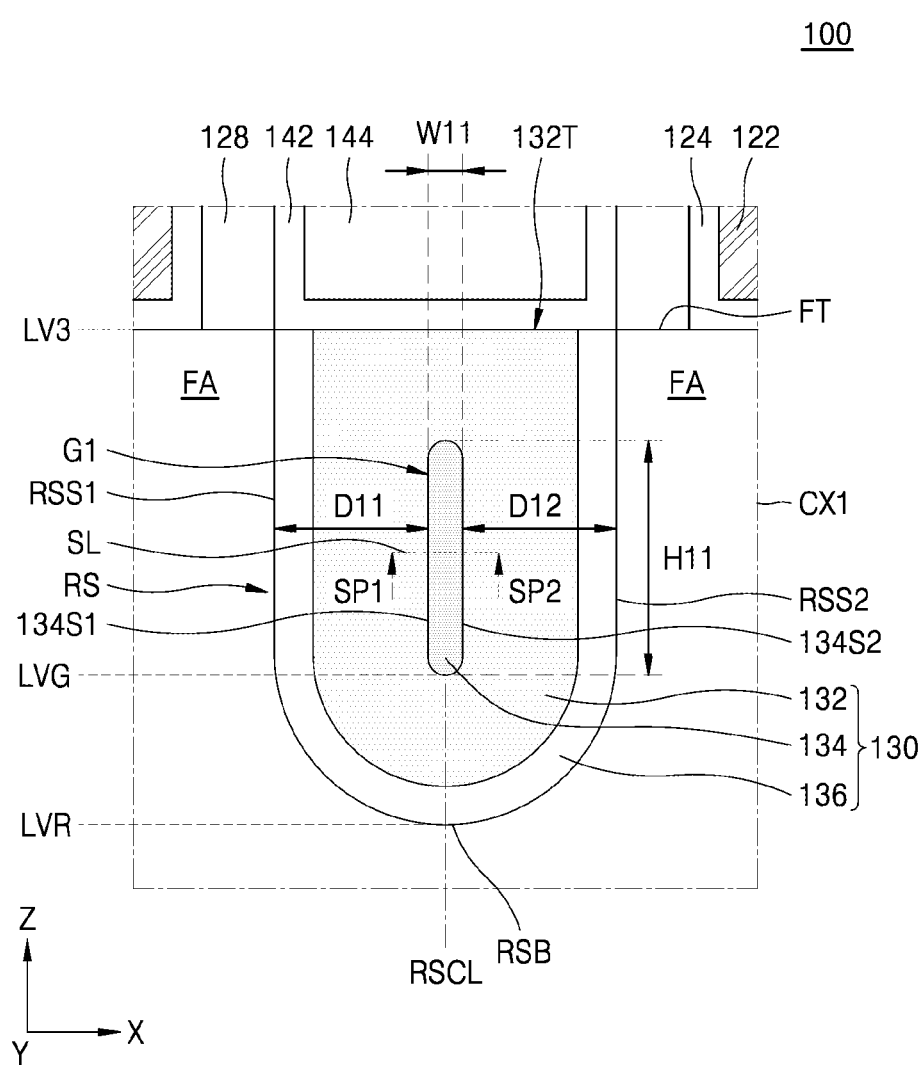
FIG. 5 is an enlarged view of a region CX1 in FIG. 2.

FIG. 1 is a layout diagram showing an integrated circuit device 100 according to example embodiments. FIG. 2 is a cross-sectional view taken along a line A-A' of FIG. 1, FIG. 3 is a cross-sectional view taken along a line B-B' of FIG. 1, and FIG. 4 is a cross-sectional view taken along a line C-C' of FIG. 1. FIG. 5 is an enlarged view of a region CX1 in FIG. 2. FIG. 1 shows only some components of the integrated circuit device 100, e.g., an array of a fin-type active region FA and a gate structure GS.

Referring to FIGS. 1 to 5, the fin-type active region FA may protrude from a top surface 110F1 of a substrate 110. The fin-type active region FA may extend in a first direction (X direction in FIG. 1) parallel to the top surface 110F1 of the substrate 110. On the substrate 110, a device isolation layer 112 covering lower portions of both sidewalls of the fin-type active region FA may be disposed.

In example embodiments, the substrate 110 may include a Group IV semiconductor like Si or Ge, a Group IV-IV compound semiconductor like SiGe or SiC, or a Group III-V compound semiconductor like GaAs, InAs, or InP. The substrate 110 may include a conductive region, e.g., a well doped with an impurity or a structure doped with an impurity. The fin-type active region FA may be an active region constituting an NMOS transistor or may be an active region constituting a PMOS transistor.

A gate structure GS extending in a second direction (Y direction in FIG. 1) parallel to the top surface 110F1 of the substrate 110 may be disposed on the fin-type active region FA and the device isolation layer 112. For example, as shown in FIG. 1, a first gate structure GS1 and a second gate structure GS2 may be spaced apart from each other, extend in the second direction, and intersect with the fin-type active region FA extending in the first direction.

The gate structure GS may include a gate electrode 122, a gate insulation layer 124, a gate capping layer 126, and/or a gate spacer 128.

The gate electrode 122 may include a doped polysilicon, a metal, a conductive metal nitride, a conductive metal carbide, a conductive metal silicide, or a combination thereof. For example, the gate electrode 122 may include Al, Cu, Ti, Ta, W, Mo, TaN, NiSi, CoSi, TiN, WN, TiAl, TiAlN, TaCN, TaC, TaSiN, or a combination thereof, but is not limited thereto. According example embodiments, the gate electrode 122 may include a work-function metal-containing layer and a gap-fill metal film. The work function metal-containing layer may include at least one metal selected from among Ti, W, Ru, Nb, Mo, Hf, Ni, Co, Pt, Yb, Tb, Dy, Er, and Pd. The gap-fill metal film may be a W film or an Al film. According to example embodiments, the gate electrode 122 may include a stacked structure of TiAlC/TiN/W, a stacked structure of TiN/TaN/TiAlC/TiN/W, or a stacked structure of TiN/TaN/TiN/TiAlC/TiN/W, but is not limited thereto.

The gate insulation layer 124 may be disposed to extend in the second direction on the bottom surface and sidewalls of the gate electrode 122. The gate insulation layer 124 may be between the gate electrode 122 and the fin-type active region FA and between the gate electrode 122 and the top surface of the device isolation layer 112. The gate insulation layer 124 may include a silicon oxide film, a silicon oxynitride film, a high-k film having a dielectric constant that is higher than that of the silicon oxide film, or a combination thereof. The high-k film may include a metal oxide or a metal oxynitride. For example, the high-k film that may be used as the gate insulation layer 124 may include, but is not limited to, $HfO_2$, HfSiO, HfSiON, HfTaO, HfTiO, HfZrO, $ZrO_2$, $Al_2O_3$, or a combination thereof.

The gate capping layer 126 may be disposed on the gate electrode 122. The gate capping layer 126 covers the top surface of the gate electrode 122 and may extend in the second direction (Y direction in FIG. 1). According to example embodiments, the gate capping layer 126 may include a silicon nitride or a silicon oxynitride.

Gate spacers 128 may be disposed on both sidewalls of the gate electrode 122 and on both sidewalls of the gate capping layer 126. The gate spacers 128 may extend on both sidewalls of the gate electrode 122 in the direction in which the gate electrode 122 extends, and the gate insulation layer 124 may be between the gate electrode 122 and the gate spacers 128. In example embodiments, the gate spacer 128 may include a silicon oxide ($SiO_x$), a silicon nitride ($SiN_x$), a silicon oxynitride ($SiO_xN_y$), a silicon carbide nitride ($SiC_xN_y$), a silicon oxide carbonitride ($SiO_xC_yN_z$), or a combination thereof.

In example embodiments, the gate spacers 128 may include a plurality of layers including different materials. FIG. 2 shows an example in which the gate spacer 128 includes a single layer. Alternatively, the gate spacer 128 may include a first spacer layer (not shown), a second spacer layer (not shown), and a third spacer layer (not shown) that are sequentially stacked on a sidewall of the gate electrode 122. In example embodiments, the first spacer layer and the third spacer layer may include a silicon nitride, a silicon oxide, or a silicon oxynitride. The second spacer layer may include an insulating material having a dielectric constant that is lower than that of the first spacer layer. In some embodiments, the second spacer layer may include an air space.

The source/drain regions 130 may be disposed at the fin-type active regions FA on both sides of the gate structure GS. The source/drain regions 130 may fill the interior of recess regions RS extending into the fin-type active regions FA on both sides of the gate structure GS. A bottom level LVR of the recess region RS may be higher than a level LV1 of the top surface 110F1 of the substrate 110, and the bottom level LVR of the recess region RS may be higher than a bottom surface level LV2 of a portion of the gate structure GS contacting the device isolation layer 112. As shown in FIG. 3, the source/drain regions 130 may have a polygonal shape with an inclined sidewall 130F1 in the second direction (Y direction).

In example embodiments, the source/drain regions 130 may include an upper semiconductor layer 132, a gap-fill semiconductor layer 134, and/or a lower semiconductor layer 136. The lower semiconductor layer 136 may be conformally disposed on the inner wall of the recess region RS, the upper semiconductor layer 132 may fill the recess region RS above the lower semiconductor layer 136, and the gap-fill semiconductor layer 134 may fill a gap G1 disposed in the center portion of the upper semiconductor layer 132.

In example embodiments, the upper semiconductor layer 132 may include an epitaxial semiconductor layer to which a first impurity is doped at a first impurity concentration. The upper semiconductor layer 132 may include, but is not limited to, a doped Si film, a doped Ge film, a doped SiC film, a doped SiGe film, or a doped InGaAs film. In example embodiments, when the fin-type active region FA is an active region for an NMOS transistor, the upper semiconductor layer 132 may include SiC doped with the first impurity or Si doped with the first impurity, and the first impurity may be phosphorus (P), arsenic (As), antimony (Sb), etc. In other embodiments, when the fin-type active region FA is an active region for a PMOS transistor, the source/drain regions 130 may include SiGe doped with the first impurity, and the first impurity may be boron (B), gallium (Ga), etc. In example embodiments, the first impurity concentration may be within the range from about 1E20 atoms/cm$^3$ to about 1E22 atoms/cm$^3$, but is not limited thereto.

In example embodiments, the gap-fill semiconductor layer 134 may include an epitaxial semiconductor layer to which the first impurity is doped at a second impurity concentration that is higher than the first impurity concentration. The gap-fill semiconductor layer 134 may include, but is not limited to, a doped Si film, a doped Ge film, a doped SiC film, a doped SiGe film, or a doped InGaAs film. In example embodiments, the second impurity concentration may be within the range from about 110% to about 150% of the first impurity concentration, but is not limited thereto.

In example embodiments, the lower semiconductor layer 136 may include an epitaxial semiconductor layer to which the first impurity is doped at a third impurity concentration that is lower than the first impurity concentration. The lower semiconductor layer 136 may include, but is not limited to, a doped Si film, a doped Ge film, a doped SiC film, a doped SiGe film, or a doped InGaAs film. In example embodiments, the third impurity concentration may be within the range from about 1E20 atoms/cm$^3$ to about 5E21 atoms/cm$^3$, but is not limited thereto.

As shown in FIG. 5, the gap G1 may extend in a third direction (Z direction) in the center portion of the upper semiconductor layer 132, and the gap-fill semiconductor layer 134 may extend in the third direction and fill the interior of the gap G1. As shown in FIG. 3, the gap-fill semiconductor layer 134 may have a rounded polygonal cross-section in the first direction (X direction), but the inventive concepts are not limited thereto.

As shown in FIG. 5, a bottom level LVG of the gap G1 may be higher than the bottom level LVR of the recess region RS, and thus the bottom of the gap-fill semiconductor layer 134 may be at a level higher than the bottom surface of the upper semiconductor layer 132. A top surface level LVGT of the gap-fill semiconductor layer 134 may be lower than a topmost surface level of the upper semiconductor layer 132, and the top surface of the gap-fill semiconductor layer 134 may be covered by the upper semiconductor layer 132. Although FIG. 5 shows that a topmost surface 132T of the upper semiconductor layer 132 is located at the same level as a vertical level LV3 of a top surface FT of the fin-type active region FA, the inventive concepts are not limited thereto.

In example embodiments, entire surfaces of the gap-fill semiconductor layer 134 may be substantially surrounded by the upper semiconductor layer 132 or in contact with the upper semiconductor layer 132. Therefore, the gap-fill semiconductor layer 134 may not be in contact with an inner wall of the recess region RS or exposed to the outside of the source/drain regions 130.

In example embodiments, the gap-fill semiconductor layer 134 may have a first width W11 in the first direction (X direction) and a first height H11 in the third direction (Z direction). In example embodiments, the first width W11 may be within the range from about 0.5 nm to about 10 nm, and the first height H11 may be within the range from about 5 nm to about 100 nm. However, the inventive concepts are not limited thereto. The ratio of the first height H11 to the first width W11 of the gap-fill semiconductor layer 134 may be from about 2 to about 10, but is not limited thereto.

In an example manufacturing process, in an epitaxial process for forming the upper semiconductor layer 132 within the recess region RS, process conditions may be adjusted to form the gap G1 that extends relatively long in the third direction (Z direction) and has a relatively narrow width (e.g., a width corresponding to the first width W11) in the first direction (X direction). In this case, source materials used for forming the upper semiconductor layer 132 may be trapped or piled up within the gap G1. Vaporization of a source material of the first impurity from among the source materials may be suppressed, and the source material of the first impurity may be condensed to a relatively high concentration within the gap G1. As a result, the gap-fill semiconductor layer 134 filling the interior of the gap G1 may be formed. As described above, the second impurity concentration of the first impurity included in the gap-fill semiconductor layer 134 may be from about 110% to about 150% of the first impurity concentration of the first impurity included in the upper semiconductor layer 132, but is not limited thereto.

In example embodiments, the gap G1 may extend in the third direction in the center portion of the upper semiconductor layer 132, and thus the gap-fill semiconductor layer 134 filling the interior of the gap G1 may overlap a center line RSCL of the recess region RS that bisects the recess region RS in the first direction (X direction). and extends in the third direction (Z direction).

As shown in FIG. 5, the recess region RS may include a first sidewall RSS1, a second sidewall RSS2, and a bottom portion RSB. The first sidewall RSS1 and the second sidewall RSS2 are apart from each other in the first direction X and may be substantially perpendicular to the top surface 110F1 of the substrate 110 or inclined at an angle. The gap-fill semiconductor layer 134 may include a first sidewall 134S1 facing the first sidewall RSS1 of the recess region RS and a second sidewall 134S2 facing the second sidewall RSS2 of the recess region RS. A first distance D11 in the first direction (X direction) between the first sidewall RSS1 of the recess region RS and the first sidewall 134S1 of the gap-fill semiconductor layer 134 may be substantially identical to a second distance D12 in the first direction (X direction) between the second sidewall RSS2 of the gap-fill semiconductor layer 134 and the second sidewall 134S2 of the gap-fill semiconductor layer 134.

In an example manufacturing process, in the epitaxial process for forming the upper semiconductor layer 132 within the recess region RS, process conditions may be selected, such that a rate at which the upper semiconductor layer 132 is grown from sidewalls RSS1 and RSS2 of the recess region RS is equal to or greater than a rate at which the upper semiconductor layer 132 is grown from the bottom portion RSB of the recess region RS (e.g., a growth rate of a (110) plane of a silicon substrate is equal to or greater than a growth rate of a (001) plane of the silicon substrate). In this case, the gap G1 having a relatively small width (e.g., the first width W11) and/or a relatively larger height-to-width ratio (e.g., a ratio of the first height H11 to the first width W11) may be disposed in the upper semiconductor layer 132. Also, a distance from the first sidewall RSS1 of the recess region RS to the gap G1 (e.g., the first distance D11) may be substantially identical to a distance from the second sidewall RSS2 of the recess region RS to the gap G1 (e.g., the second distance D12). In this case, the gap G1 may be disposed at a position overlapping the center line RSCL of the recess region RS, and the gap-fill semiconductor layer 134 filling the interior of the gap G1 may also be disposed at a position overlapping the center line RSCL of the recess region RS.

A first etch stop layer 142 may be disposed on sidewalls of the gate structure GS, the source/drain regions 130, and the device isolation layer 112. The first etch stop layer 142 may be conformally disposed on sidewalls of the source/drain regions 130. The first etch stop layer 142 may include a silicon nitride. An inter-gate insulation layer 144 is disposed between the gate structure GS and another gate structure GS adjacent thereto and may cover the source/drain regions 130 and the device isolation layer 112. The inter-gate insulation layer 144 may include a silicon nitride, a silicon oxide, or a silicon oxynitride.

A second etch stop layer 152 may be disposed on the gate structure GS and the inter-gate insulation layer 144. The second etch stop layer 152 may include a silicon nitride. A first interlayer insulating film 154 may be disposed on the second etch stop layer 152. The first interlayer insulating film 154 may include a silicon oxide film, a TEOS film, or an ultra-low K (ULK) film having a very low dielectric constant from about 2.2 to about 2.4. The ULK film may include a SiOC film or a SiCOH film.

Generally, the width of the gate structure GS and the width of the source/drain regions 130 decrease and the volume of the source/drain regions 130 decreases due to the downscaling tendency of an integrated circuit device. However, as the volume of the source/drain regions 130 decreases, the resistance of the source/drain regions 130 increases or the resistance of a contact (not shown) connected to the source/drain regions 130 increases, the downscaling of an integrated circuit device is restricted.

However, according to the integrated circuit device 100 described above, the gap-fill semiconductor layer 134 may fill the interior of the gap G1 of the upper semiconductor layer 132, and the second impurity concentration of the gap-fill semiconductor layer 134 may be greater than the first impurity concentration of the upper semiconductor layer 132. Therefore, the source/drain regions 130 may have a relatively low resistance even when the size of the source/drain regions 130 is small, and thus the integrated circuit device 100 may exhibit excellent performance.

The impurity concentration of the source/drain regions 130 of the integrated circuit device 100 and the electrical performance of the integrated circuit device 100 will be described below with reference to FIGS. 32 and 33.

Figure 32:
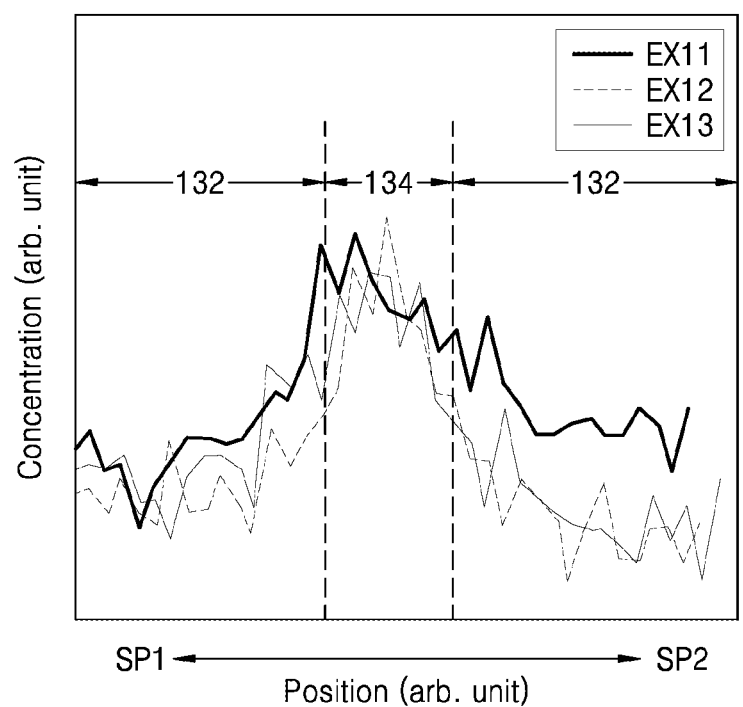
FIG. 32 is a graph showing concentration of a first impurity included in source/drain regions of an integrated circuit device according to example embodiments.

FIG. 32 is a graph showing first impurity concentrations for positions along a scan line SL between scan points SP1 and SP2 in the source/drain regions 130 of FIG. 5. In FIG. 32, a first experiment example EX11, a second experiment example EX12, and a third experiment example EX13 show first impurity concentrations regarding a plurality of source/drain regions 130 included in the integrated circuit device 100 described with reference to FIGS. 1 to 5, respectively.

Referring to FIG. 32, it may be seen that the impurity concentration of the gap-fill semiconductor layer 134 is significantly higher than the impurity concentration of the upper semiconductor layer 132. The reason thereof may be that, in a process for forming the upper semiconductor layer 132, source materials used for forming the upper semiconductor layer 132 may be trapped or piled up in the gap G1, and a first impurity from among the source materials may be condensed to a relatively high concentration to form the gap-fill semiconductor layer 134 filling the interior of the gap G1.

Figure 33:
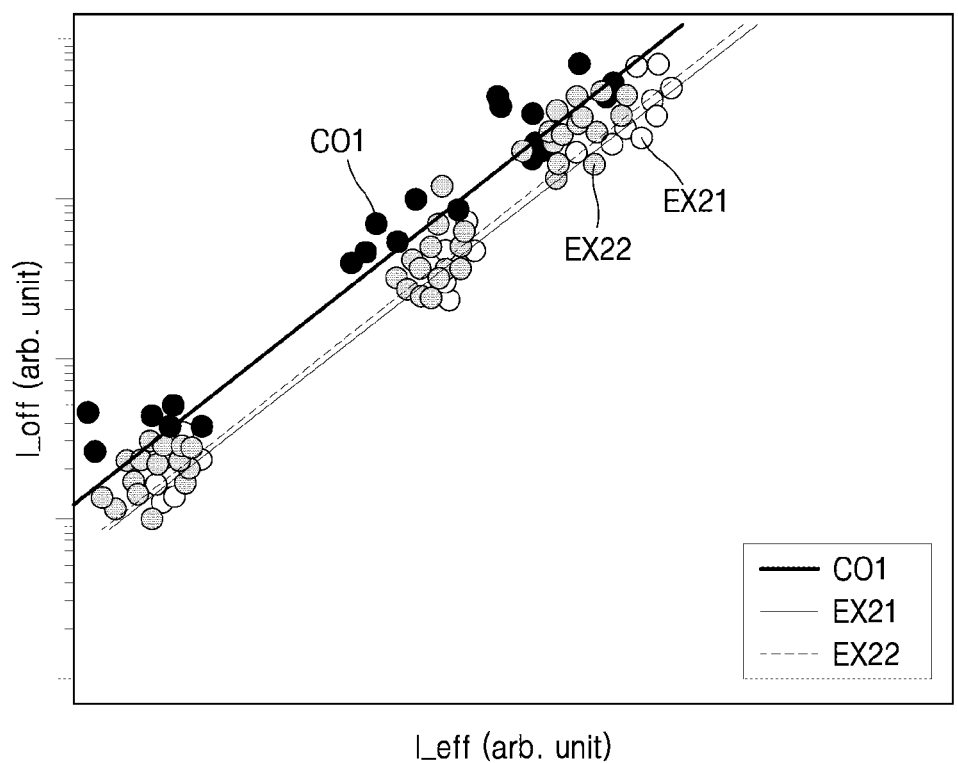
FIG. 33 is a graph of an off current I_off with respect to a turn-on current I_eff of an integrated circuit device according to example embodiments.

FIG. 33 is a graph of an off current I_off with respect to a turn-on current I_eff of the integrated circuit device 100 according to example embodiments. In FIG. 33, a fourth experiment example EX21 and a fifth experiment example EX22 show operating current graphs using the integrated circuit device 100 described above with reference to FIGS. 1 to 5, and a comparative example CO1 shows an operating current graph using an integrated circuit device in which the gap G1 is not disposed in the upper semiconductor layer 132 and the gap-fill semiconductor layer 134 is not formed. For example, the integrated circuit device according to the comparative example may include source/drain regions having a structure similar to that of first source/drain regions 230 shown in FIGS. 20 and 21.

Referring to FIG. 33, when compared at a same off current I_off, the fourth experiment example EX21 and the fifth experiment example EX22 exhibit turn-on currents I_efff greater than that of the comparative example CO1. In other words, the integrated circuit device 100 according to example embodiments includes the gap-fill semiconductor layer 134 having an impurity concentration that is greater than that of the upper semiconductor layer 132, and thus the integrated circuit device 100 exhibits improved electrical performance.

Figure 6:
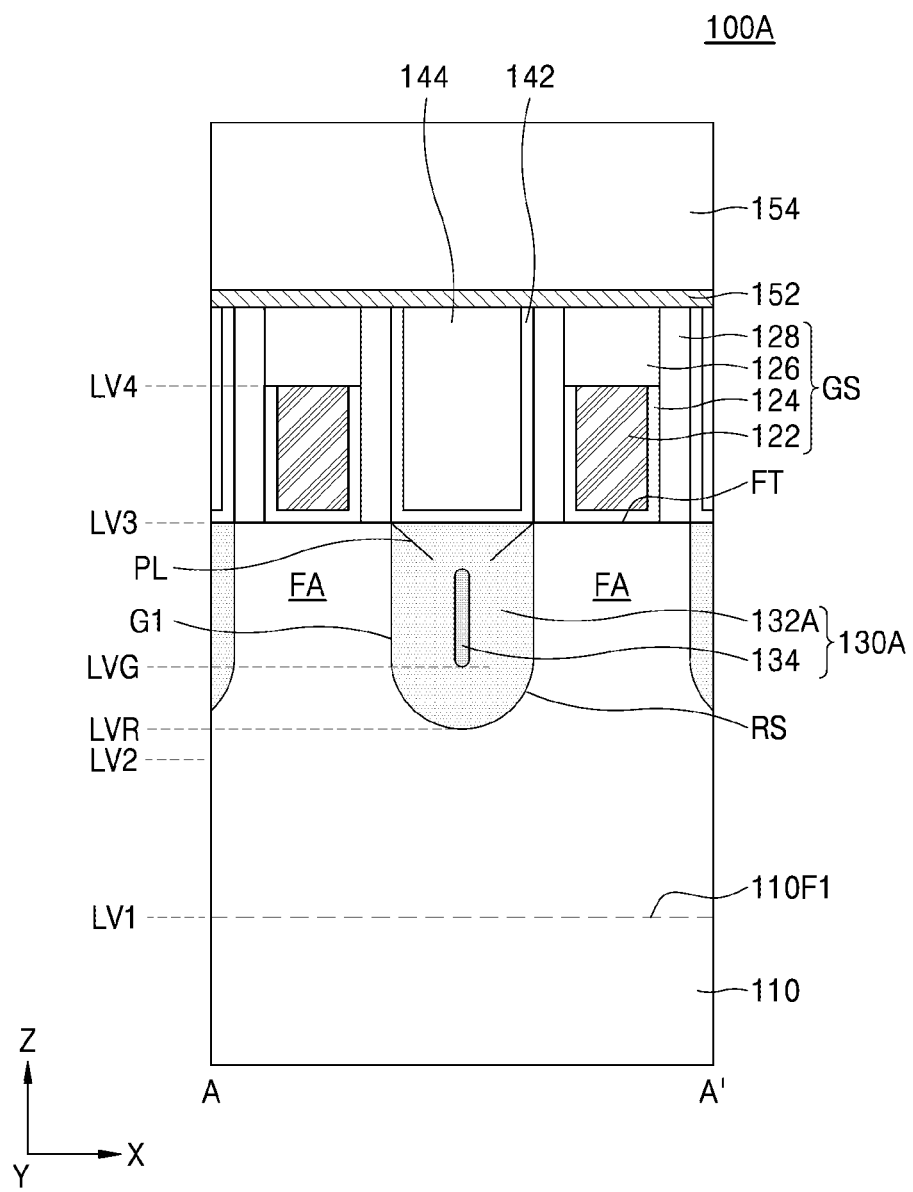
FIGS. 6 and 7 are cross-sectional views of an integrated circuit device according to example embodiments.
Figure 7:
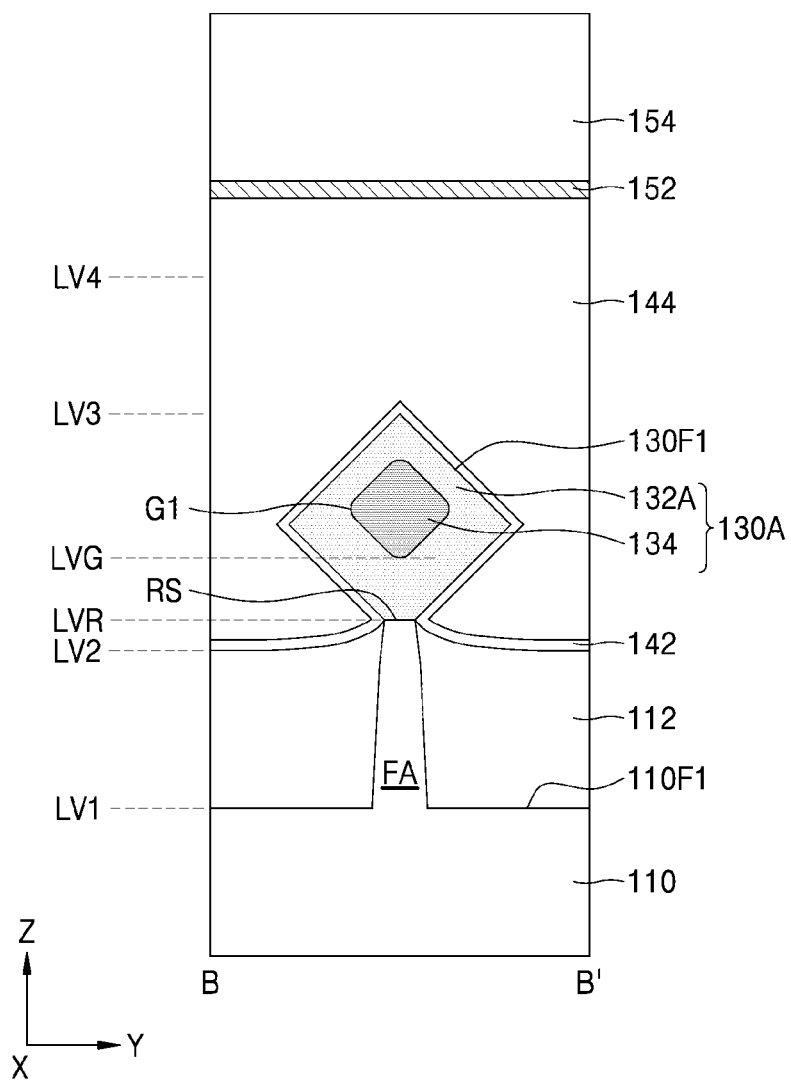

FIGS. 6 and 7 are cross-sectional views of an integrated circuit device 100A according to example embodiments. FIG. 6 shows a cross-section taken along a line A-A' of FIG. 1, and FIG. 7 shows a cross-section taken along a line B-B' of FIG. 1. In FIGS. 6 and 7, reference numerals that are the same as those in FIGS. 1 to 5 denote the same components. The integrated circuit device 100A of FIGS. 6 and 7 is similar to the integrated circuit device 100 described above with reference to FIGS. 1 to 5, except that the lower semiconductor layer 136 is omitted in the integrated circuit device 100A of FIGS. 6 and 7.

Referring to FIGS. 6 and 7, source/drain regions 130A may include an upper semiconductor layer 132A disposed directly on the inner wall of the recess region RS, and the upper semiconductor layer 132A may contact the fin-type active region FA. The gap G1 extending in the third direction (Z direction) may be disposed in the center portion of the upper semiconductor layer 132A, and the gap-fill semiconductor layer 134 may fill the interior of the gap G1.

At least one plane defect PL, which is inclined at a certain angle from the top surface of the upper semiconductor layer 132A and extends toward the interior of the upper semiconductor layer 132A, may be provided on both sides of the upper semiconductor layer 132A. As shown in FIG. 6, the at least one plane defect PL may extend only within the upper semiconductor layer 132A and may not engage with the gap-fill semiconductor layer 134. Alternatively, the at least one plane defect PL may extend longer than that shown in FIG. 6 and engage with the gap-fill semiconductor layer 134.

In example embodiments, the at least one plane defect PL may be a stacking fault. For example, in the epitaxial process for forming the upper semiconductor layer 132, when growth conditions exhibiting a relatively high growth rate in the sidewall-wise direction of the recess region RS (e.g., growth conditions corresponding to a relatively high growth rate of the (110) plane of a silicon substrate) are used, the gap G1 extending in the third direction may be formed. Under such growth conditions, the gate spacer 128 disposed on the topmost surface of the recess region RS may cause a stacking fault in a portion of the upper semiconductor layer 132 adjacent to the gate spacer 128, and thus at least one plane defect PL may be formed.

Figure 8:
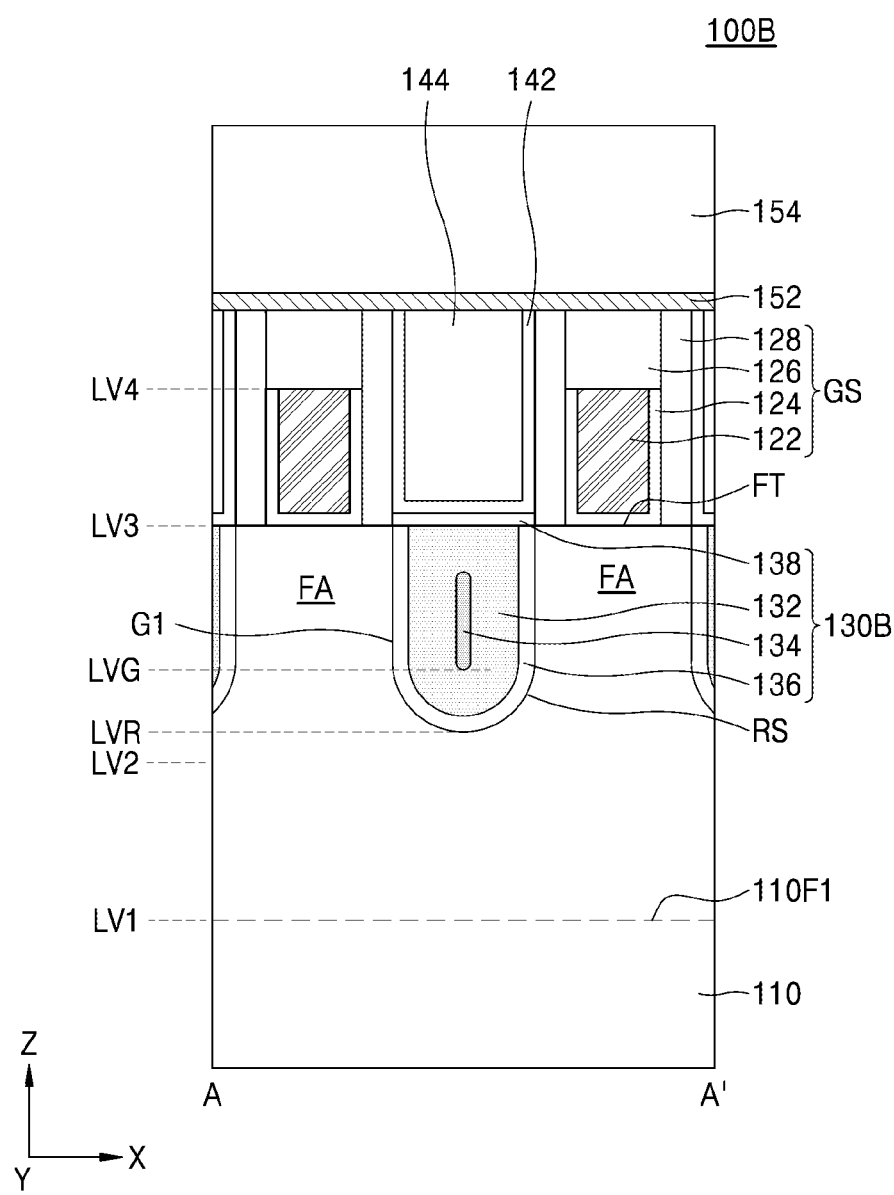
FIGS. 8 and 9 are cross-sectional views of an integrated circuit device according to example embodiments.
Figure 9:
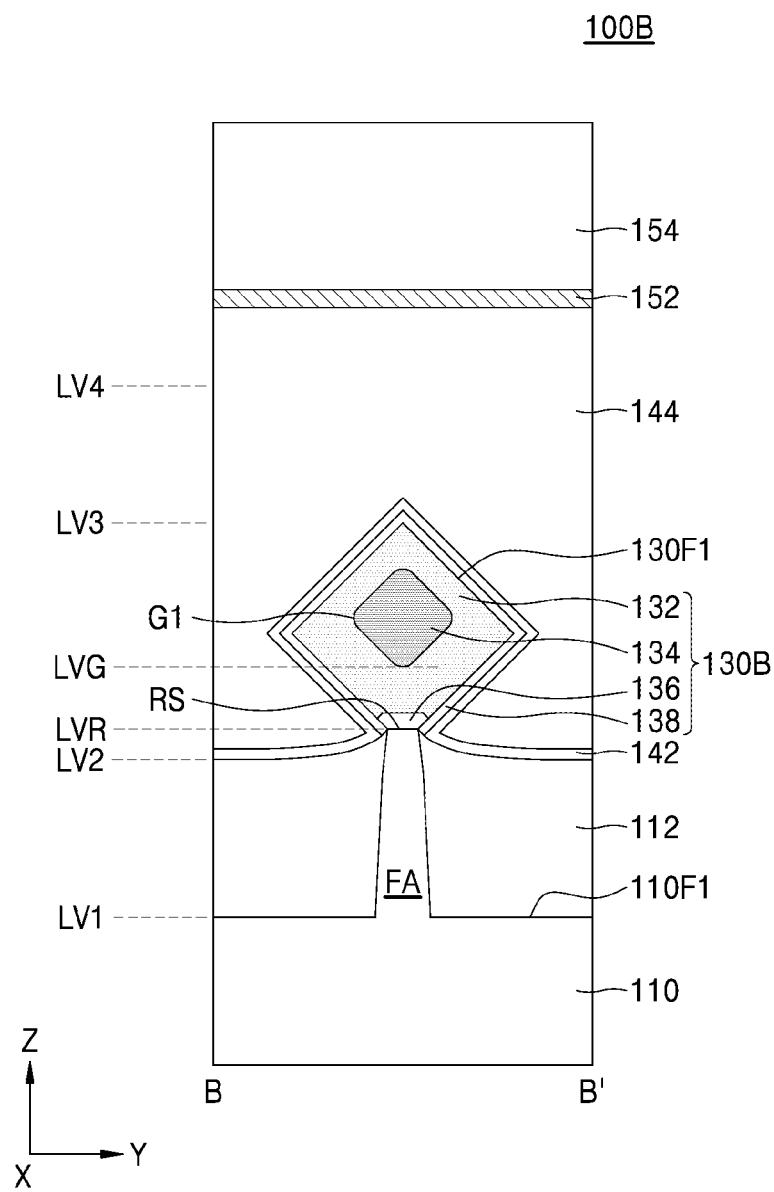

FIGS. 8 and 9 are cross-sectional views of an integrated circuit device 100B according to example embodiments. FIG. 8 shows a cross-section taken along a line A-A' of FIG. 1, and FIG. 9 shows a cross-section taken along a line B-B' of FIG. 1. In FIGS. 8 and 9, reference numerals that are the same as those in FIGS. 1 to 6 denote the same components.

Referring to FIGS. 8 and 9, source/drain regions 130B may further include a capping semiconductor layer 138. The capping semiconductor layer 138 may be conformally disposed to cover the entire surface of the upper semiconductor layer 132. The first etch stop layer 142 may be disposed on the capping semiconductor layer 138, and the upper semiconductor layer 132 may not contact the first etch stop layer 142.

In example embodiments, the capping semiconductor layer 138 may not be doped with an impurity or may include an epitaxial semiconductor layer to which a first impurity is doped at a fourth impurity concentration. The fourth impurity concentration may be less than the first impurity concentration of the first impurity included in the upper semiconductor layer 132. For example, the fourth impurity concentration may be within the range from about 1E19 atoms/cm$^3$ to about 1E21 atoms/cm$^3$, but is not limited thereto. The capping semiconductor layer 138 may include, but is not limited to, a doped Si film, a doped Ge film, a doped SiC film, a doped SiGe film, or a doped InGaAs film.

Figure 10:
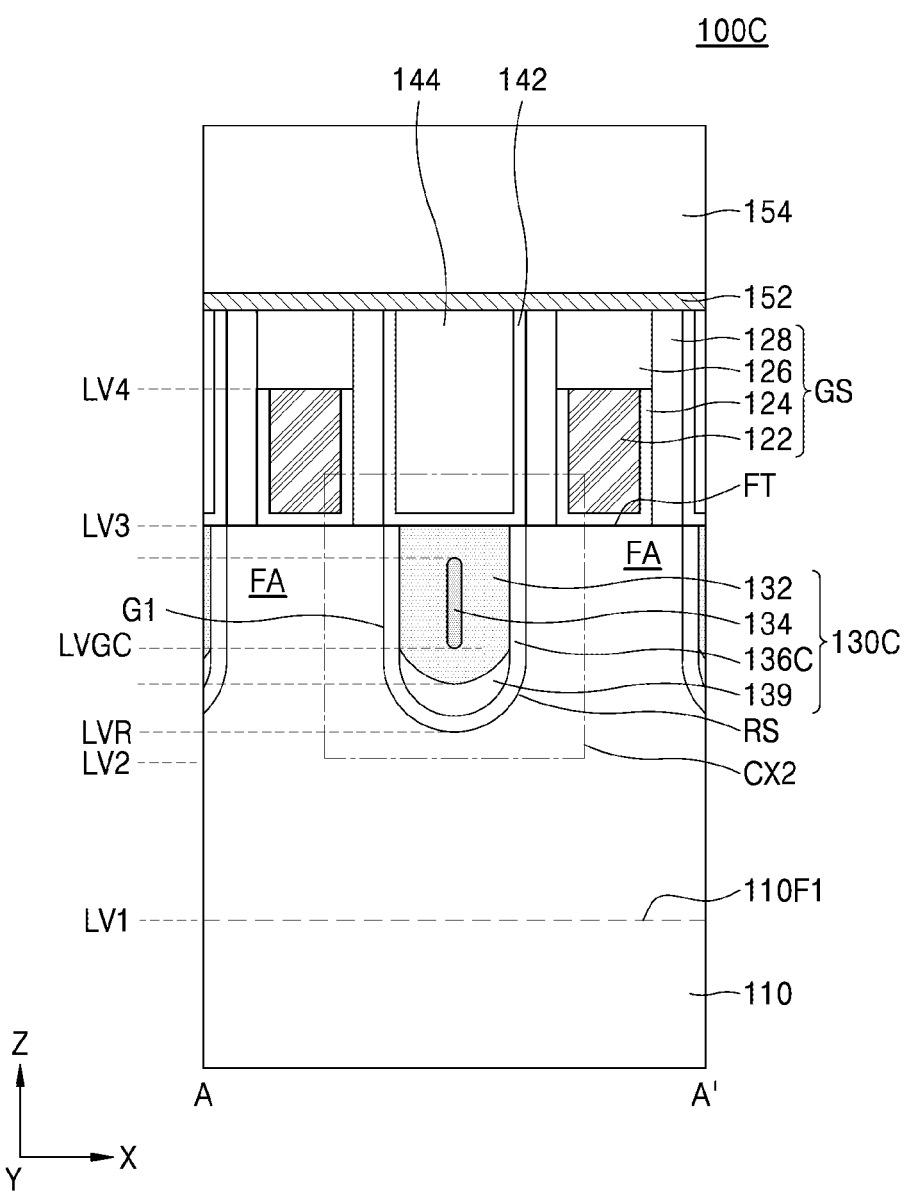
FIGS. 10 to 12 are cross-sectional views of an integrated circuit device according to example embodiments.
Figure 11:
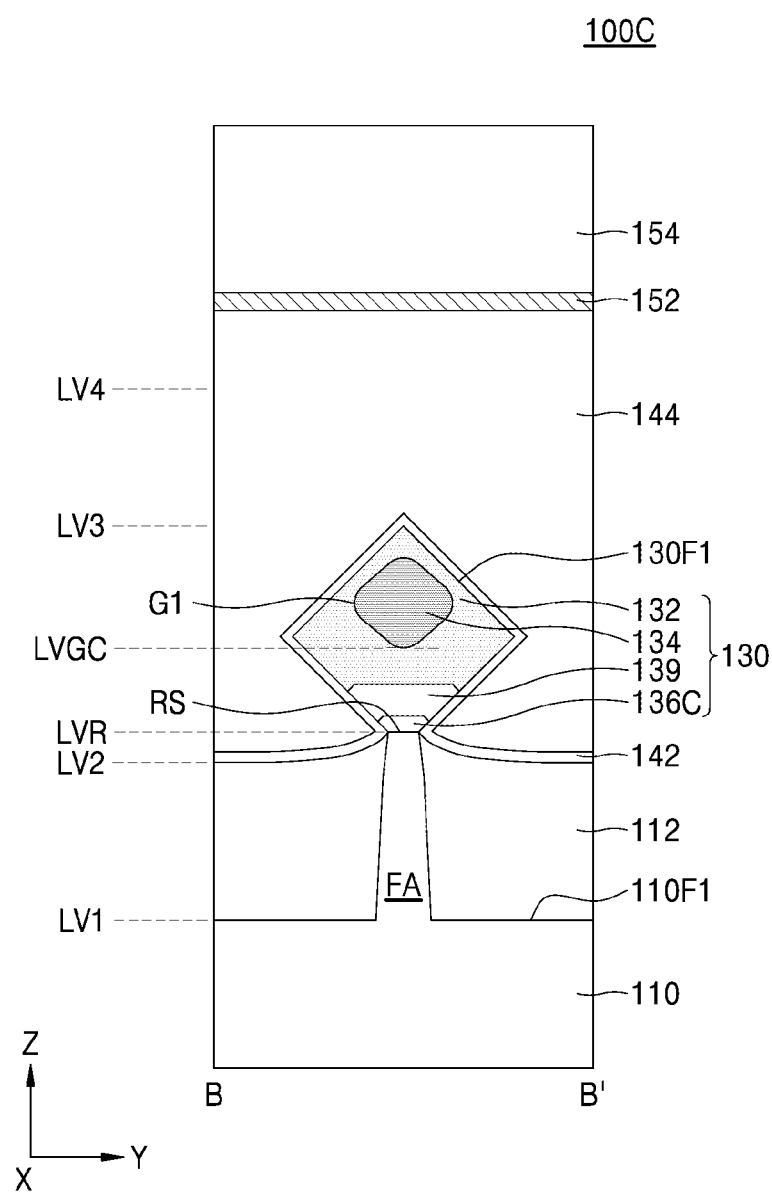
Figure 12:
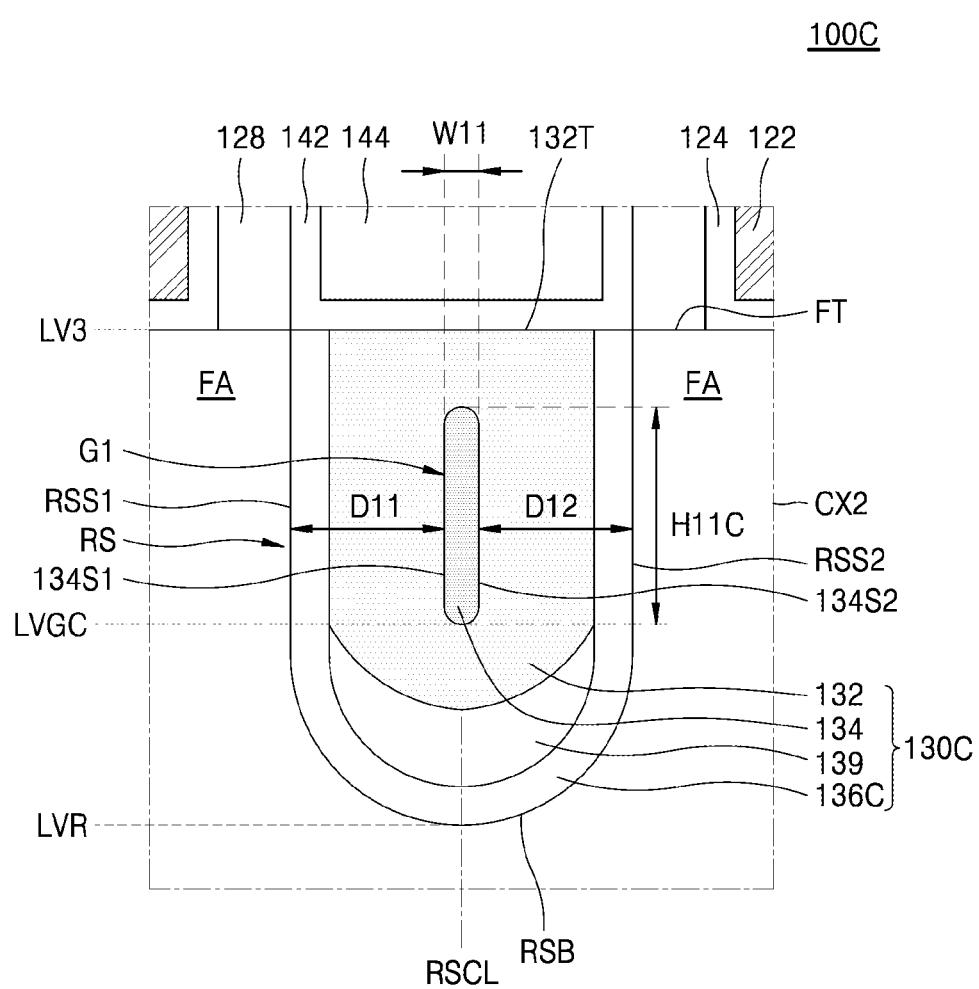

FIGS. 10 to 12 are cross-sectional views of an integrated circuit device 100C according to example embodiments. FIG. 10 shows a cross-section taken along a line A-A' of FIG. 1, and FIG. 11 shows a cross-section taken along a line B-B' of FIG. 1. FIG. 12 shows an enlarged view of a region CX2 in FIG. 10. In FIGS. 10 to 12, reference numerals that are the same as those in FIGS. 1 to 9 denote the same components.

Referring to FIGS. 10 to 12, source/drain regions 130C may further include an intermediate semiconductor layer 139 disposed between a lower semiconductor layer 136C and the upper semiconductor layer 132.

The intermediate semiconductor layer 139 may partially fill the bottom portion of the recess region RS on the lower semiconductor layer 136C. The upper semiconductor layer 132 is disposed on the lower semiconductor layer 136C and the intermediate semiconductor layer 139 and may fill the interior of the recess region RS. As shown in FIG. 11, the upper sidewall of the upper semiconductor layer 132 may contact the lower semiconductor layer 136C, and the lower sidewall and the bottom portion of the upper semiconductor layer 132 may contact the intermediate semiconductor layer 139.

The intermediate semiconductor layer 139 may include an epitaxial semiconductor layer to which the first impurity is doped at a fifth impurity concentration. The fifth impurity concentration may be less than the first impurity concentration of the first impurity included in the upper semiconductor layer 132. For example, the fifth impurity concentration may be within the range from about 1E20 atoms/cm$^3$ to about 5E21 atoms/cm$^3$, but is not limited thereto. The intermediate semiconductor layer 139 may include, but is not limited to, a doped Si film, a doped Ge film, a doped SiC film, a doped SiGe film, or a doped InGaAs film.

The lower semiconductor layer 136C may not be doped with an impurity or may include an epitaxial semiconductor layer to which the first impurity is doped at the third impurity concentration. The third impurity concentration may be less than the first impurity concentration of the first impurity included in the upper semiconductor layer 132. For example, the third impurity concentration may be within the range from about 1E19 atoms/cm$^3$ to about 5E21 atoms/cm$^3$, but is not limited thereto. The lower semiconductor layer 136C may not be doped with an impurity and may include an epitaxial semiconductor layer to which an impurity is doped at a relatively low concentration, and thus the lower semiconductor layer 136C may function as a barrier layer reducing or preventing a current leakage from the source/drain regions 130C to the fin-type active region FA.

A bottom level LVGC of the gap G1 may be higher than the bottom level LVG of the gap G1 in the integrated circuit device 100 described above with reference to FIGS. 1 to 5, but the inventive concepts are not limited thereto. A first height H11C of the gap-fill semiconductor layer 134 in the third direction (Z direction) may be less than the first height H11 of the gap-fill semiconductor layer 134 in the three directions (Z direction) in the integrated circuit device 100 described above with reference to FIGS. 1 to 5, but the inventive concepts are not limited thereto.

Figure 13:
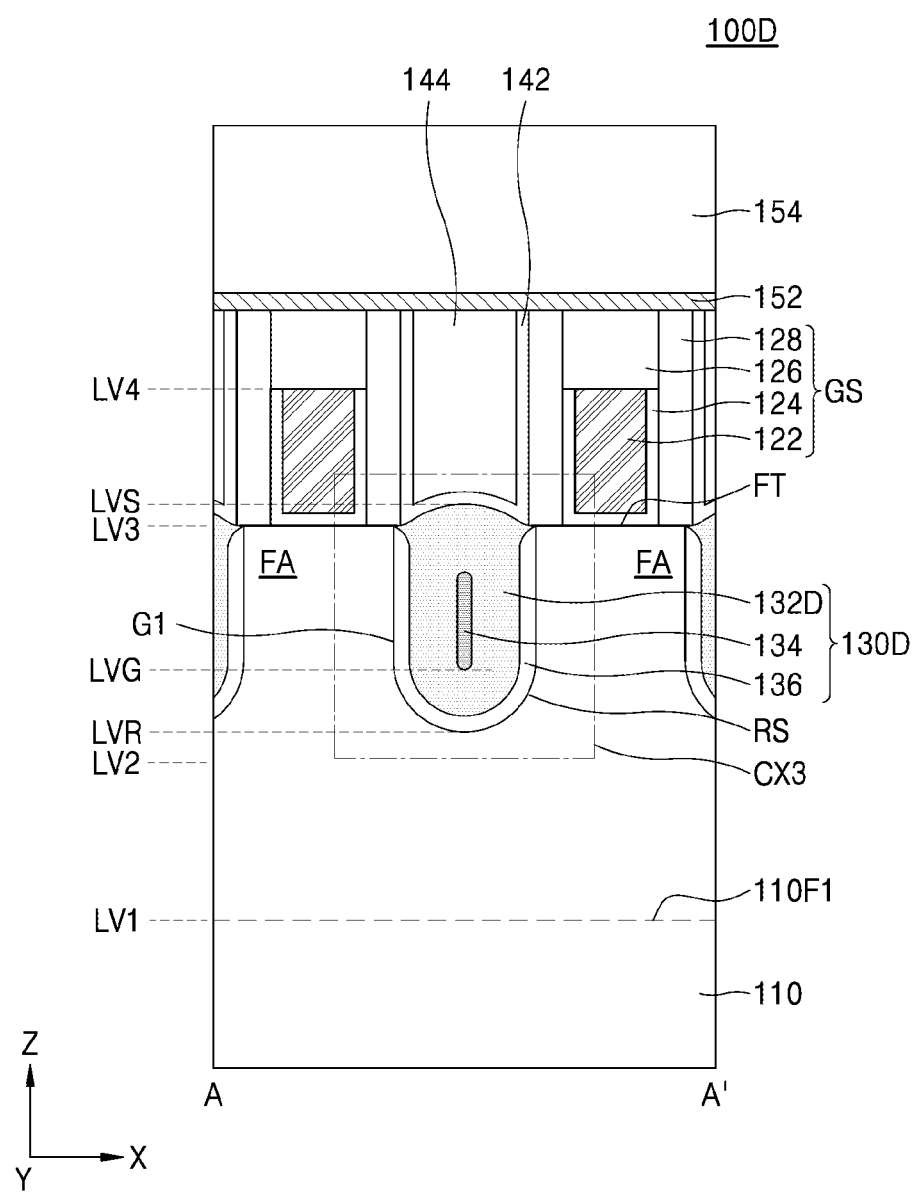
FIGS. 13 to 15 are cross-sectional views of an integrated circuit device according to example embodiments.
Figure 14:
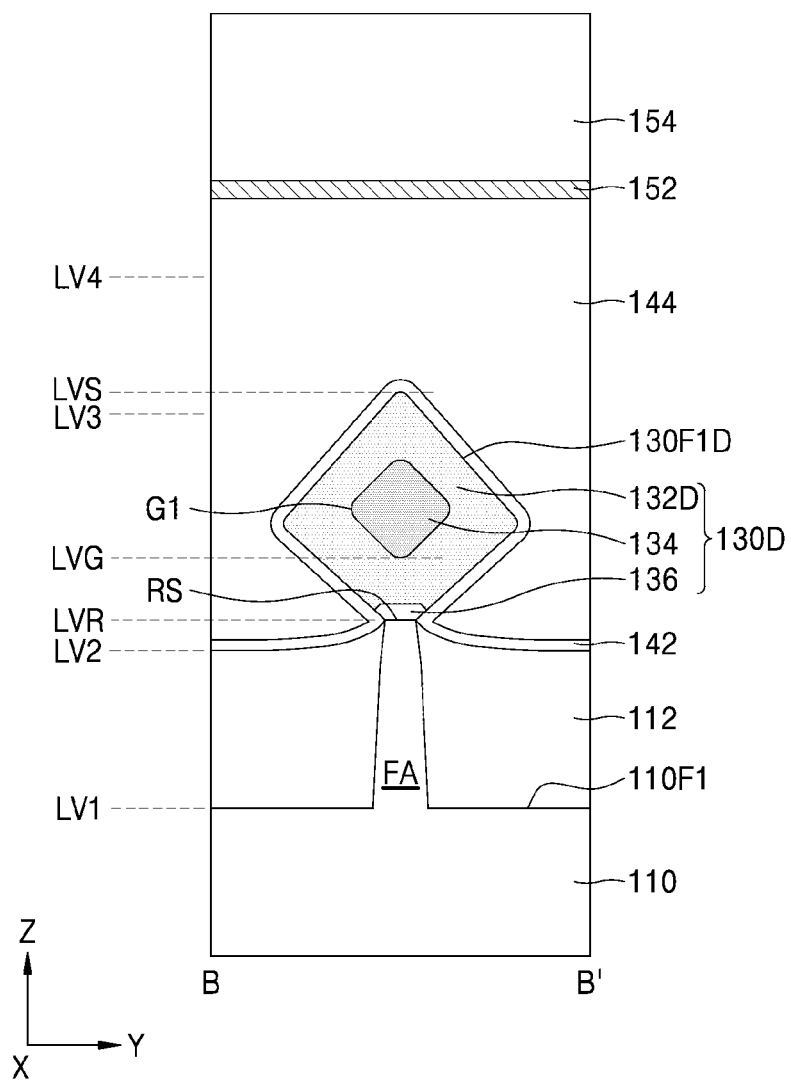
Figure 15:
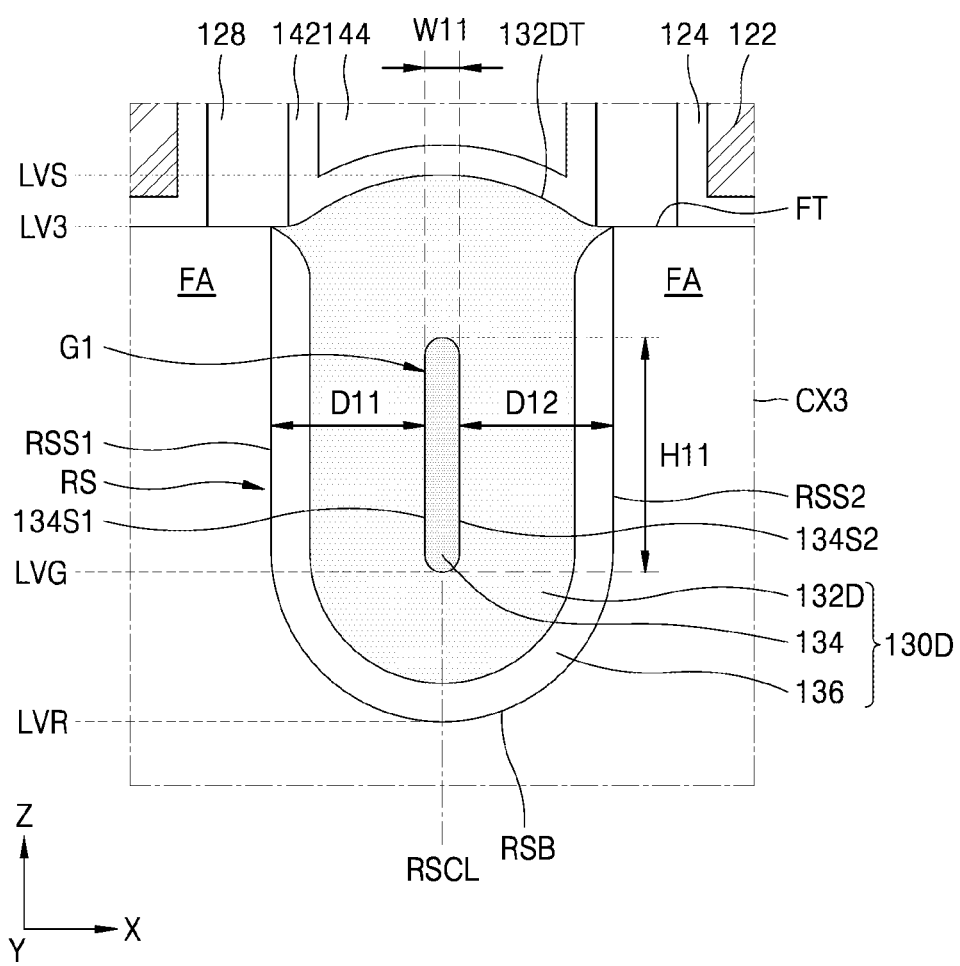

FIGS. 13 to 15 are cross-sectional views of an integrated circuit device 100D according to example embodiments. FIG. 13 shows a cross-section taken along a line A-A' of FIG. 1, and FIG. 14 shows a cross-section taken along a line B-B' of FIG. 1. FIG. 15 shows an enlarged view of a region CX3 in FIG. 13. In FIGS. 13 to 15, reference numerals that are the same as those in FIGS. 1 to 12 denote the same components.

Referring to FIGS. 13 to 15, source/drain regions 130D may include a upper semiconductor layer 132D having a rounded polygonal shape and an inclined sidewall 130F1D in the first direction (X direction). For example, the upper semiconductor layer 132D may constitute a portion of raised source/drain regions, and a vertical level LVS of a top surface 132DT of the upper semiconductor layer 132D may be higher than the vertical level LV3 of the top surface FT of the fin-type active region FA. On the other hand, the vertical level LVS of the top surface 132DT of the upper semiconductor layer 132D may be lower than a level LV4 of the top surface of the gate electrode 122.

As shown in FIG. 15, in an etching process for forming the recess region RS, a portion of the fin-type active region FA located below the gate spacer 128 portion may be further removed and expanded in lateral directions, and the recess region RS may vertically overlap a portion of the gate spacer 128. A portion of the lower semiconductor layer 136 disposed adjacent to the gate spacer 128 on the inner wall of the recess region RS may have a rounded top surface.

According to the integrated circuit device 100D described above, the source/drain regions 130D may have a relatively large volume within a relatively narrow space, and thus the integrated circuit device 100D may exhibit improved electrical performance.

Figure 16:
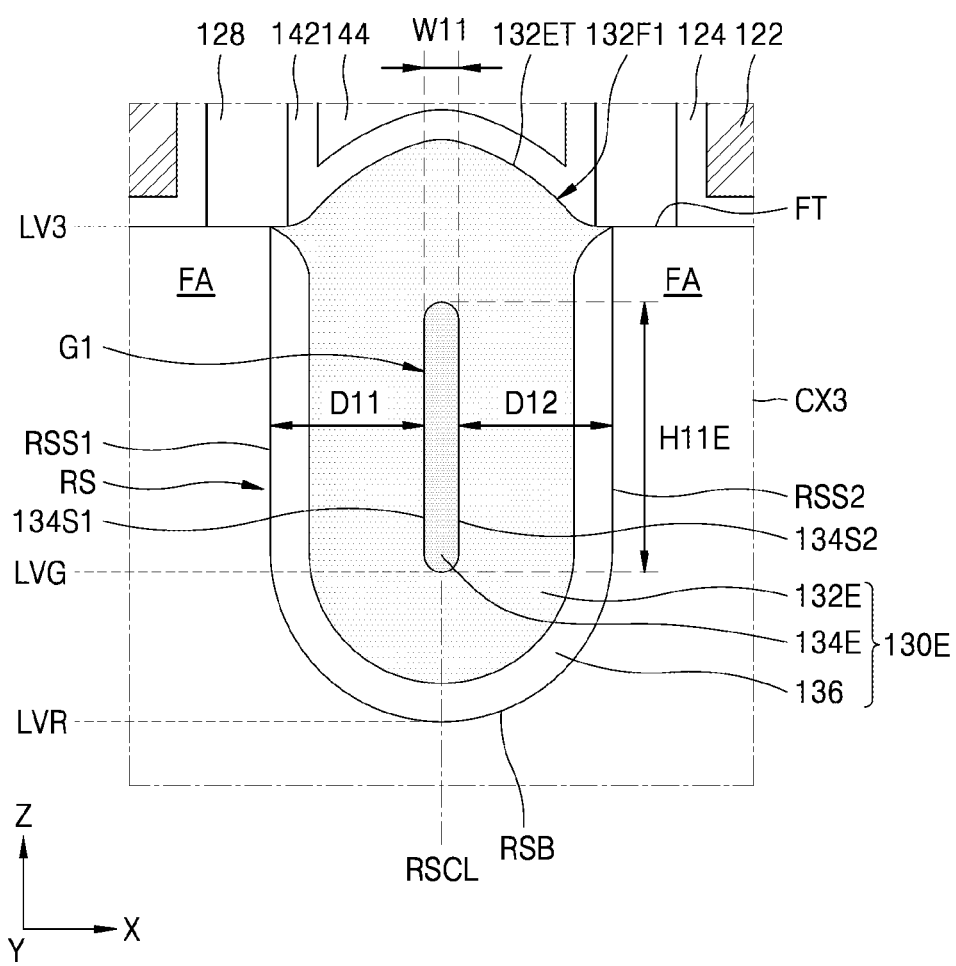
FIG. 16 is a cross-sectional view of an integrated circuit device according to example embodiments.

FIG. 16 is a cross-sectional view of an integrated circuit device 100E according to example embodiments. FIG. 16 is an enlarged view of a region corresponding to the region CX3 in FIG. 13. In FIG. 16, reference numerals that are the same as those in FIGS. 1 to 15 denote the same components.

Referring to FIG. 16, source/drain regions 130E include an upper semiconductor layer 132E, and the upper semiconductor layer 132E may have a top surface 132ET including an inclined surface 132F1. The inclined surface 132F1 of the upper semiconductor layer 132E may be inclined at an angle from about 40 degrees to about 60 degrees with respect to the top surface 110F1 of the substrate 110, and a portion of the top surface 132ET of the upper semiconductor layer 132E may be flat and rounded. The top surface 132ET of the upper semiconductor layer 132E may be located at a level higher than the vertical level LV3 of the top surface FT of the fin-type active region FA, and the upper semiconductor layer 132E may have relatively large volume. For example, the upper semiconductor layer 132E may have a volume that is larger than that of the upper semiconductor layer 132 in the integrated circuit device 100 described above with reference to FIGS. 1 to 5. Also, a first height H11E of a gap-fill semiconductor layer 134E in the third direction (Z direction) in the upper semiconductor layer 132E having a relatively large volume may also be relatively large.

According to the above-described integrated circuit device 100E, the source/drain regions 130E and/or the gap-fill semiconductor layer 134E may have a relatively large volume in a relatively narrow space, and thus the integrated circuit device 100E may exhibit improved electrical performance.

Figure 17:
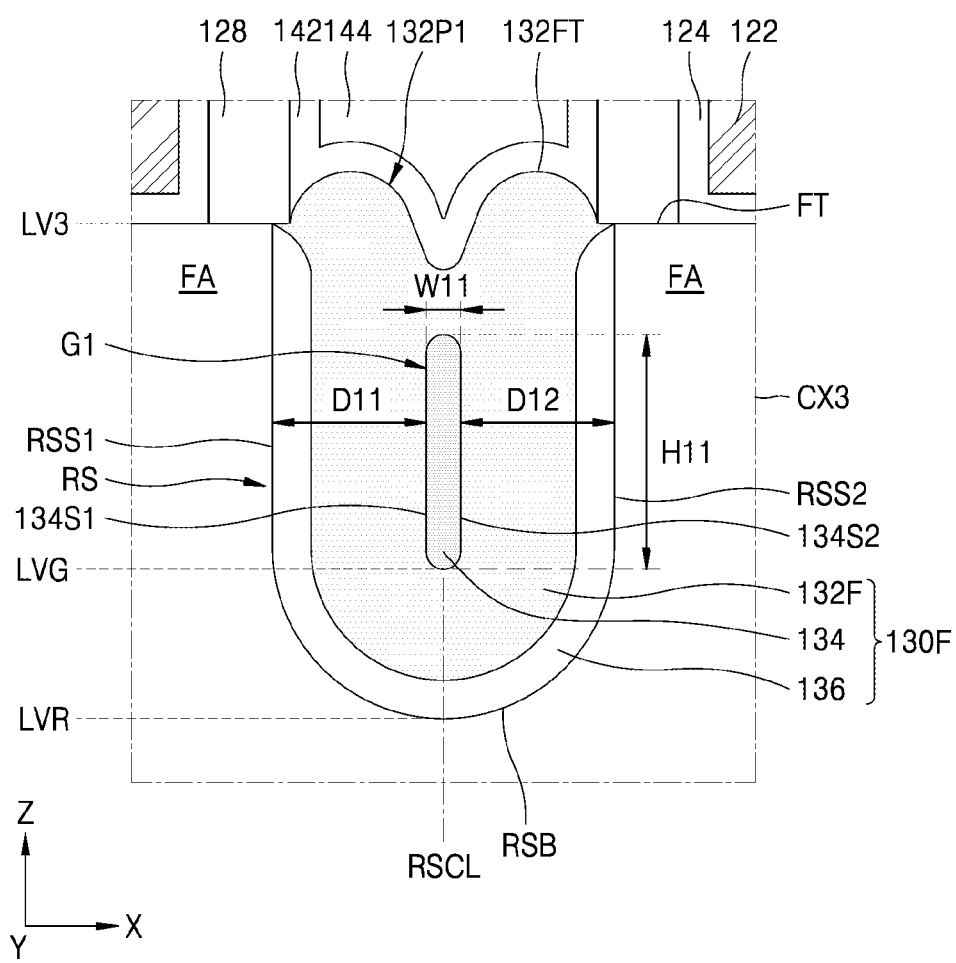
FIG. 17 is a cross-sectional view of an integrated circuit device according to example embodiments.

FIG. 17 is a cross-sectional view of an integrated circuit device 100F according to example embodiments. FIG. 17 is an enlarged view of a region corresponding to the region CX3 in FIG. 13. In FIG. 17, reference numerals that are the same as those in FIGS. 1 to 16 denote the same components.

Referring to FIG. 17, source/drain regions 130F include an upper semiconductor layer 132F, and the upper semiconductor layer 132F may have a top surface 132FT including a protruding portion 132P1. For example, the protruding portion 132P1 may be disposed at both ends of the upper semiconductor layer 132F adjacent to the gate spacer 128. The level of the top surface 132FT of the upper semiconductor layer 132F in the protruding portion 132P1 may be higher than the vertical level LV3 of the top surface FT of the fin-type active region FA.

According to the integrated circuit device 100F described above, the source/drain regions 130F may have a relatively large volume within a relatively narrow space, and thus the integrated circuit device 100F may exhibit improved electrical performance.

Figure 18:
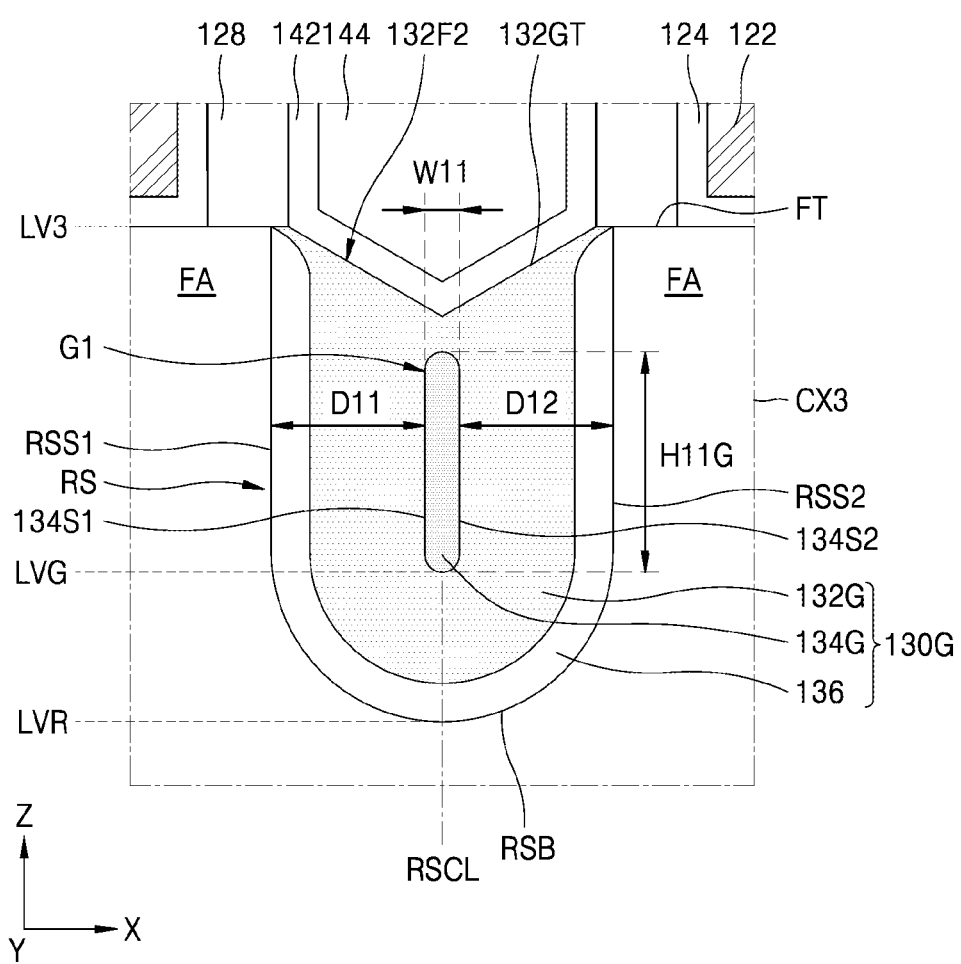
FIG. 18 is a cross-sectional view of an integrated circuit device according to example embodiments.

FIG. 18 is a cross-sectional view of an integrated circuit device 100G according to example embodiments. FIG. 18 is an enlarged view of a region corresponding to the region CX3 in FIG. 13. In FIG. 18, reference numerals that are the same as those in FIGS. 1 to 17 denote the same components.

Referring to FIG. 18, source/drain regions 130G include an upper semiconductor layer 132G, and the upper semiconductor layer 132G may have a top surface 132GT including an inclined surface 132F2. The inclined surface 132F2 of the upper semiconductor layer 132G may be inclined at an angle from about 40 to about 60 degrees with respect to the top surface 110F1 of the substrate 110, and the level of the inclined surface 132F2 of the upper semiconductor layer 132G may be gradually lowered in a direction away from the gate spacer 128. The top surface 132GT of the upper semiconductor layer 132G may be located at a level lower than the vertical level LV3 of the top surface FT of the fin-type active region FA. Also, a first height H11G of a gap-fill semiconductor layer 134G in the third direction (Z direction) may be less than the first height H11 of the gap-fill semiconductor layer 134 in the integrated circuit device 100 described above with reference to FIGS. 1 to 5.

Figure 19:
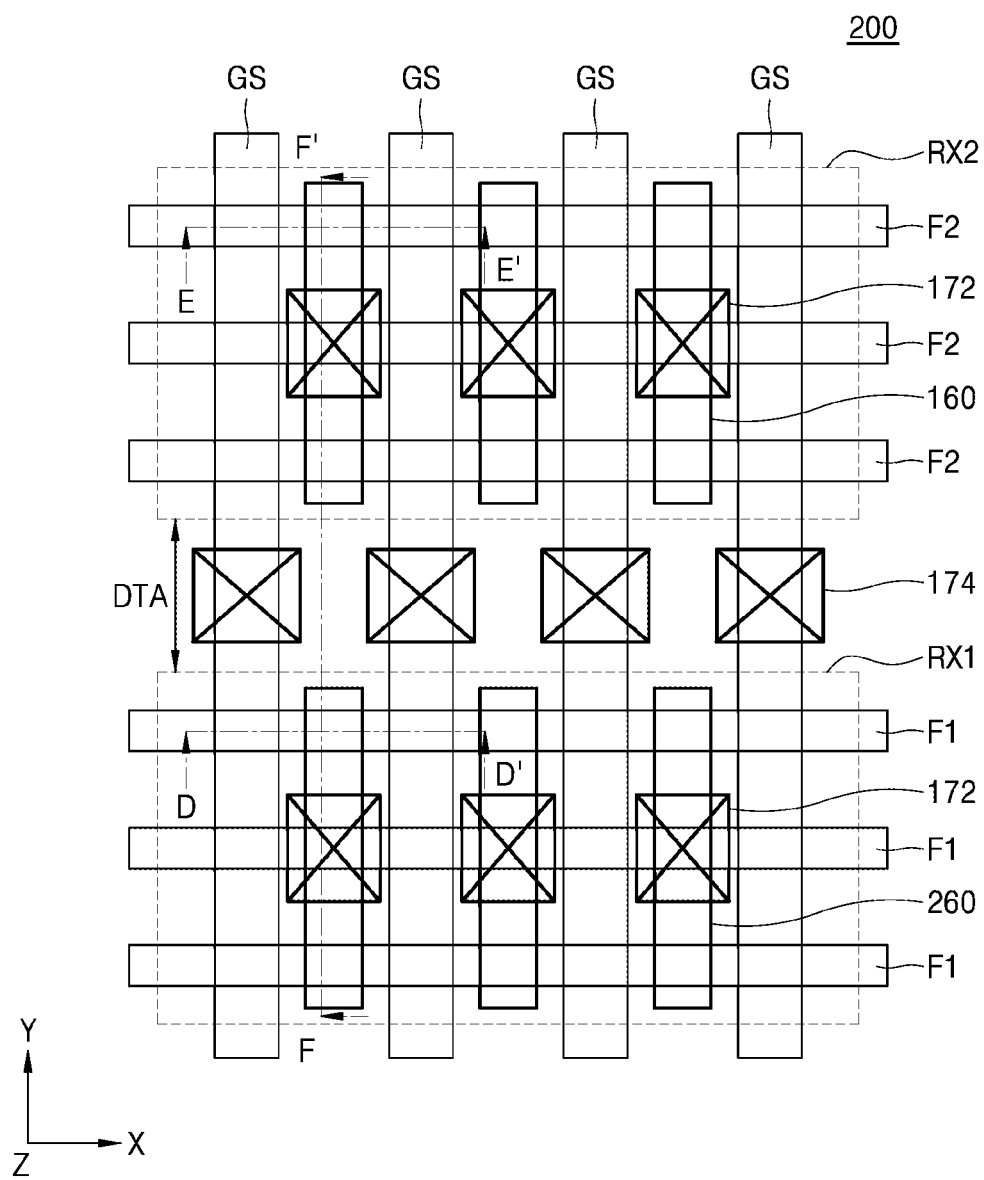
FIG. 19 is a layout diagram showing an integrated circuit device according to example embodiments.
Figure 20:
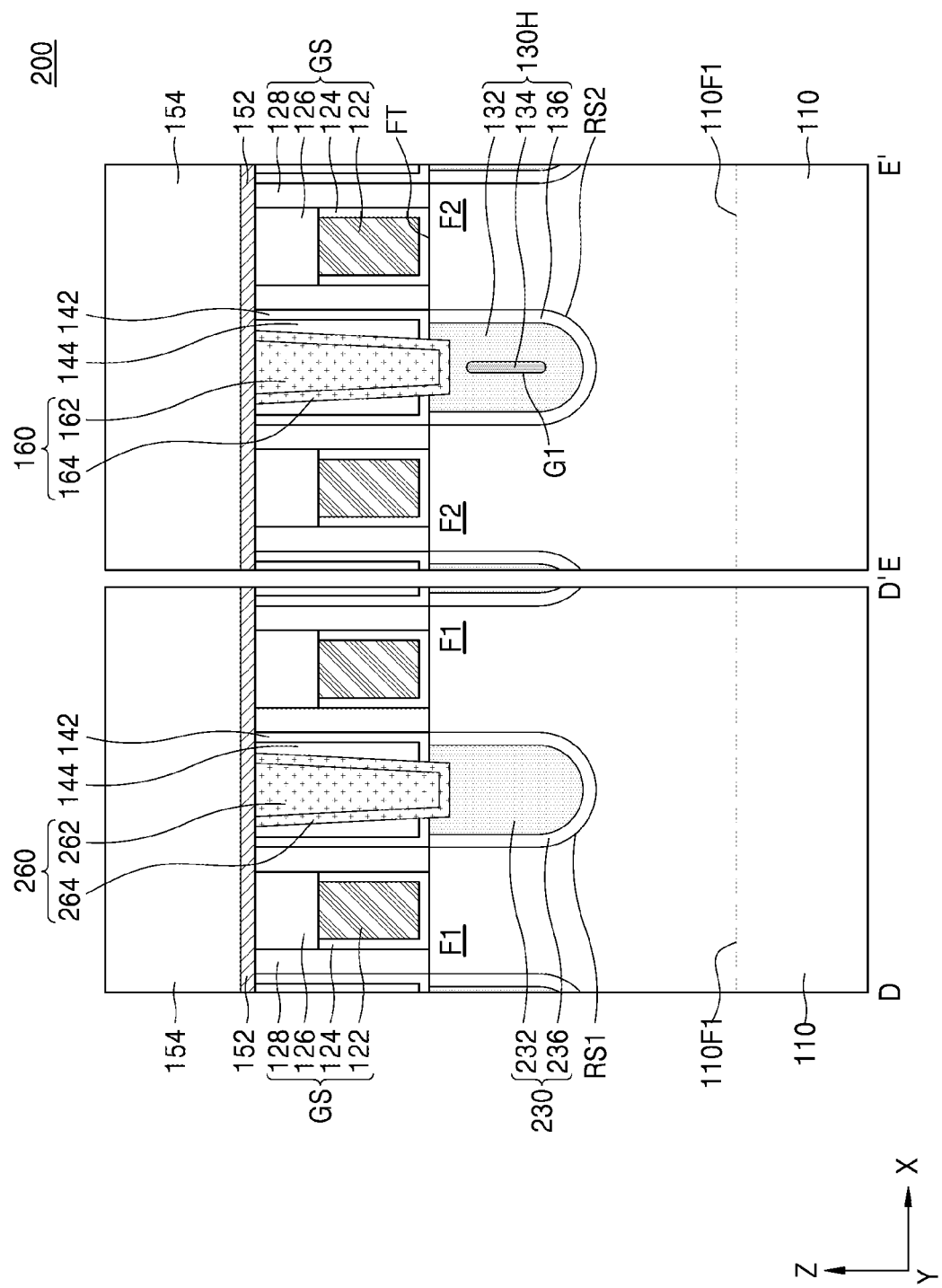
FIG. 20 is a cross-sectional view taken along lines D-D' and E-E' in FIG. 19.
Figure 21:
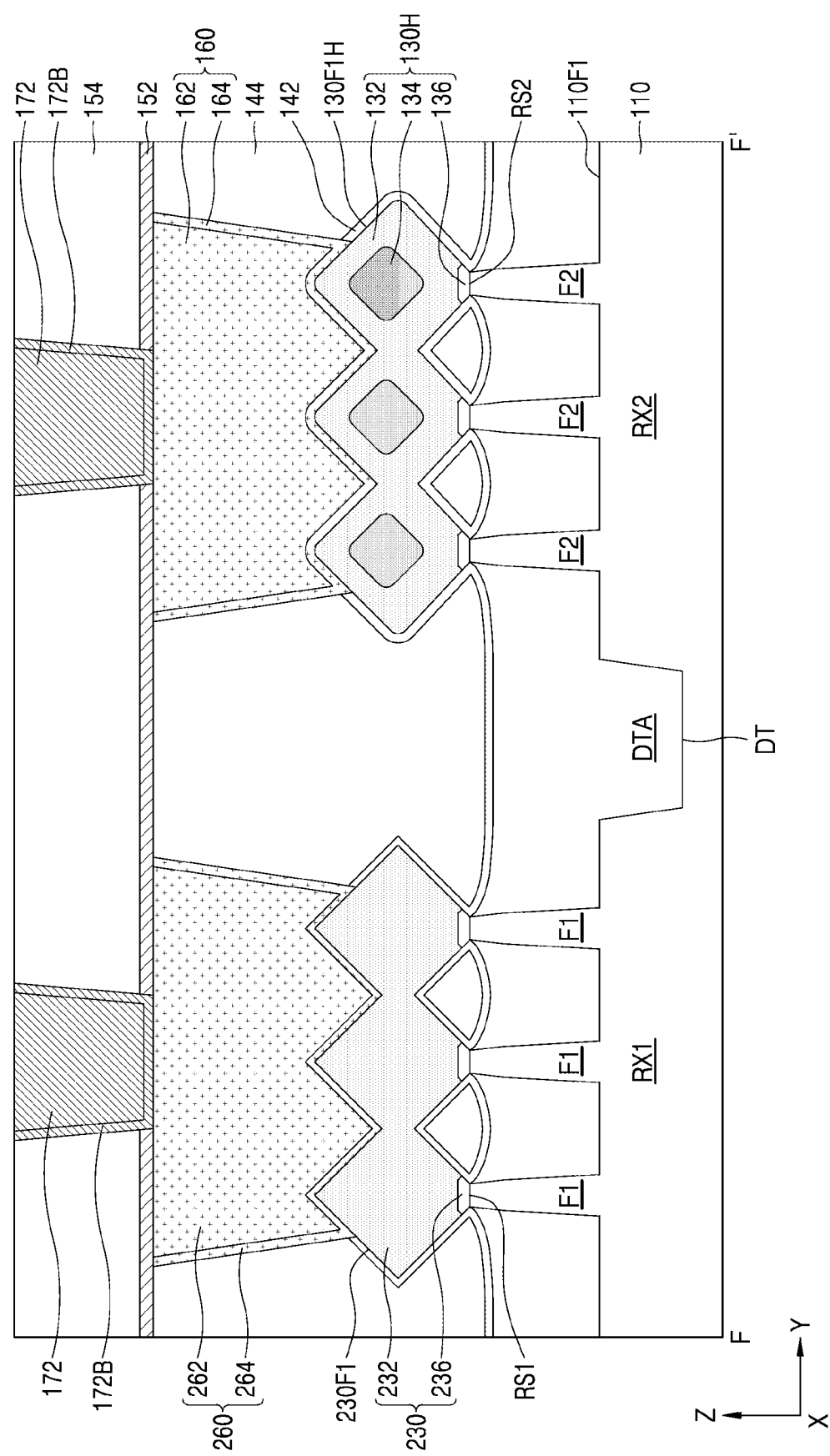
FIG. 21 is a cross-sectional view taken along a line F-F' in FIG. 19.

FIG. 19 is a layout diagram showing an integrated circuit device 200 according to example embodiments. FIG. 20 is a cross-sectional view taken along lines D-D' and E-E' in FIG. 19, and FIG. 21 is a cross-sectional view taken along a line F-F in FIG. 19. In FIGS. 19 to 21, reference numerals that are the same as those in FIGS. 1 to 18 denote the same components.

Referring to FIGS. 19 to 21, the substrate 110 includes a first active region RX1, a second active region RX2, and a deep trench region DTA. The first active region RX1 and the second active region RX2 may be apart from each other, and the deep trench region DTA may be therebetween.

In example embodiments, the first active region RX1 may be an active region for a PMOS transistor, and the second active region RX2 may be an active region for an NMOS transistor. In other embodiments, the first active region RX1 may be an active region for an NMOS transistor having a first threshold voltage, and the second active region RX2 may be an active region for an NMOS transistor having a second threshold voltage that is different from the first threshold voltage.

In example embodiments, the first active region RX1, the second active region RX2, and the deep trench region DTA may constitute a standard cell that performs logical functions. The standard cell may include various types of logic cells including a plurality of circuit elements like transistors and resistors. The logic cells may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/inverter (OAI), an AND/OR (AO), an AND/OR/inverter (AOI), a D flip-flop, a reset flip-flop, a master-slave flip-flop, a latch, etc.

A plurality of first fin-type active regions F1 may be protrude from the top surface 110F1 of the substrate 110 in the first active region RX1 and extend in the first direction (X direction). A plurality of second fin-type active regions F2 may be protrude from the top surface 110F1 of the substrate 110 in the second active region RX2 and extend in the first direction (X direction). Both sidewalls of the first fin-type active regions F1 and both sidewalls of the second fin-type active regions F2 may be covered by the device isolation layer 112. A deep trench DT may be disposed to a certain depth from the top surface 110F1 of the substrate 110 in the deep trench region DTA and the device isolation layer 112 may fill the deep trench DT.

The gate structure GS may extend in the second direction (Y direction) to intersect with the first fin-type active regions F1 and the second fin-type active regions F2. The descriptions given above with respect to FIGS. 1 to 5 may be referred to for a detailed description of the gate structure GS.

A first recessed region RS1 extending into the first fin-type active region F1 on both sides of the gate structure GS may be disposed on the first active region RX1, and the first source/drain regions 230 may be disposed in the first recess region RS1. A second recessed region RS2 extending into the second fin-type active region F2 on both sides of the gate structure GS may be disposed on the second active region RX2, and second source/drain regions 130H may be disposed in the second recess region RS2.

The first source/drain regions 230 may have a polygonal cross-section with a plurality of inclined sidewalls 230F1. As shown in FIG. 21, a sidewall portion of first source/drain regions 230 connected to one of the first fin-type active regions F1 may be connected to another sidewall portion of the first source/drain regions 230 connected to the first fin-type active region F1 adjacent thereto, but the inventive concepts are not limited thereto.

The first source/drain regions 230 may include an upper semiconductor layer 232 and a lower semiconductor layer 236. The lower semiconductor layer 236 may be conformally disposed on the inner wall of the first recessed region RS1, and the upper semiconductor layer 232 may fill the space inside the first recessed region RS1 on the lower semiconductor layer 236. The upper semiconductor layer 232 may not include a gap or a void therein.

The second source/drain regions 130H may have a rounded polygonal cross-section with a plurality of inclined sidewalls 130F1H. As shown in FIG. 21, a sidewall portion of second source/drain regions 130H connected to one of the second fin-type active regions F2 may be connected to another sidewall portion of the second source/drain regions 130H connected to the second fin-type active region F2 adjacent thereto, but the inventive concepts are not limited thereto.

The second source/drain regions 130H may include the upper semiconductor layer 132, the gap-fill semiconductor layer 134, and the lower semiconductor layer 136. The lower semiconductor layer 136 may be conformally disposed on the inner wall of the second recessed region RS2, and the upper semiconductor layer 132 may fill the space inside the second recessed region RS2 on the lower semiconductor layer 136. The upper semiconductor layer 132 may include the gap G1 at the center portion thereof, and the gap-fill semiconductor layer 134 may fill the gap G1.

In example embodiments, instead of the first source/drain regions 230 and/or the second source/drain regions 130H, the integrated circuit device 200 may include the source/drain regions 130A, 130B, 130C, 130D, 130E, 130F, and 130G described with reference to FIGS. 1 to 18 and a combination thereof.

A first contact structure 260 may be disposed to contact the first source/drain regions 230 by penetrating through the first etch stop layer 142 and the inter-gate insulation layer 144. The first contact structure 260 may include a first contact plug 262 and/or a first conductive barrier 264 surrounding the side surfaces and the bottom surface of the first contact plug 262. Alternatively, a silicide layer (not shown) may be disposed between the first conductive barrier 264 and the first source/drain regions 230.

In example embodiments, the first contact plug 262 may include at least one of tungsten (W), cobalt (Co), nickel (Ni), ruthenium (Ru), copper (Cu), aluminum (Al), a silicide thereof, and an alloy thereof. In example embodiments, the first conductive barrier 264 may include at least one of titanium nitride, titanium, tantalum nitride, tantalum, ruthenium, and ruthenium nitride.

A second contact structure 160 may be disposed to contact the second source/drain regions 130H by penetrating through the first etch stop layer 142 and the inter-gate insulation layer 144. The second contact structure 160 may include a second contact plug 162 and/or a second barrier 164 surrounding the side surfaces and the bottom surface of the second contact plug 162. Alternatively, a silicide layer (not shown) may be disposed between the second barrier 164 and the second source/drain regions 130H.

The top surfaces of the first contact structure 260 and the second contact structure 160 may be covered by the second etch stop layer 152, but the inventive concepts are not limited thereto. A via contact 172 may be disposed on the first contact structure 260 and the second contact structure 160. The via contact 172 may penetrate through the first interlayer insulating film 154 and the second etch stop layer 152 and be disposed on the top surface of the first contact structure 260 and the top surface of the second contact structure 160. As shown in FIG. 21, a conductive barrier 172B may be disposed to surround the side surfaces and the bottom surface of the via contact 172.

A gate contact 174 may be disposed on the gate structure GS. For example, the gate contact 174 may be disposed to penetrate through the first interlayer insulating film 154, the second etch stop layer 152, and the gate capping layer 126 and contact the gate electrode 122. As shown in FIG. 19, the gate contact 174 may be disposed to contact the gate structure GS on the deep trench region DTA. However, the inventive concepts are not limited thereto, and the gate contact 174 may be disposed to contact the gate structure GS on the first active region RX1 or the second active region RX2.

Figure 22:
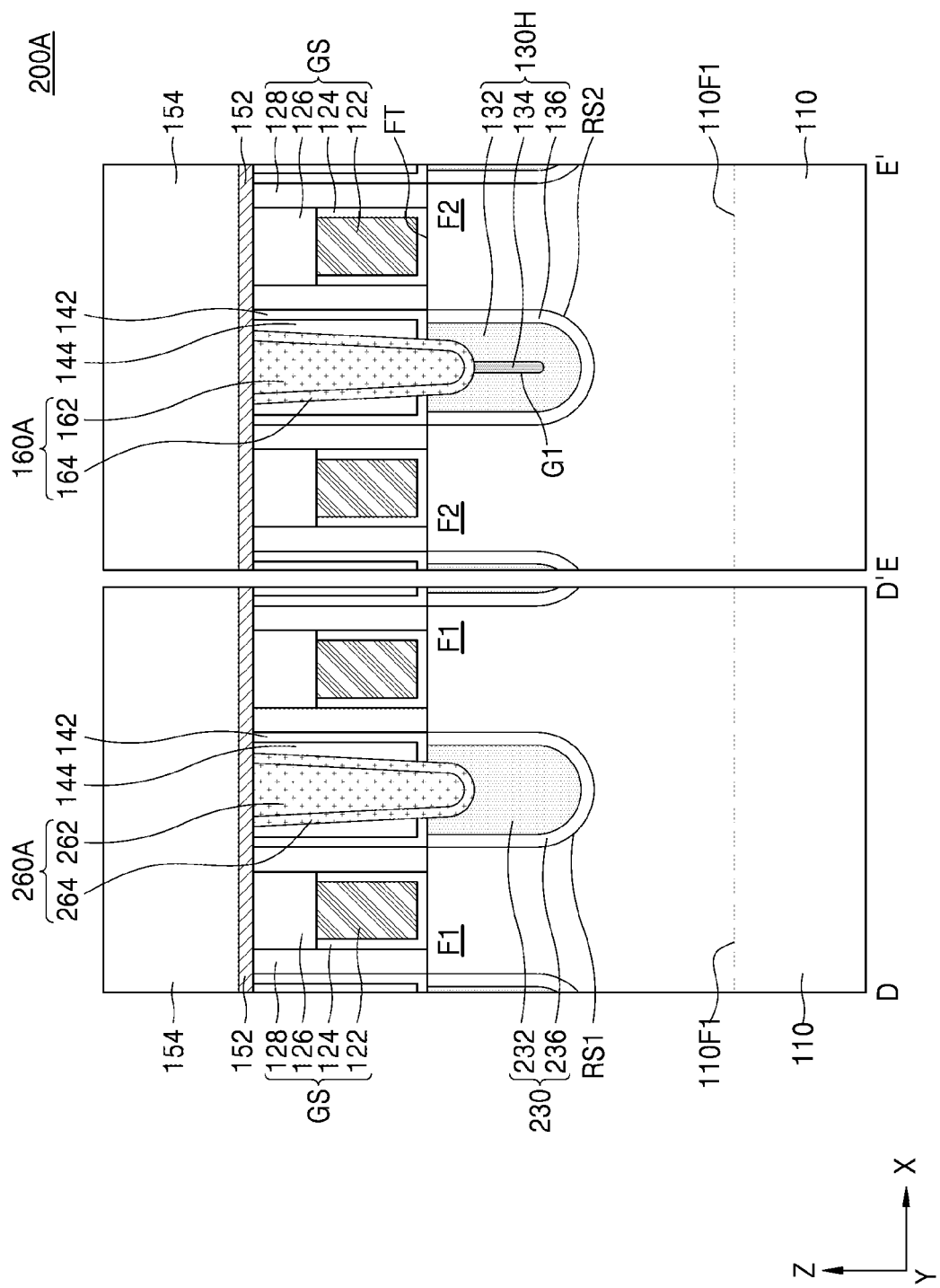
FIGS. 22 and 23 are cross-sectional views of an integrated circuit device according to example embodiments.
Figure 23:
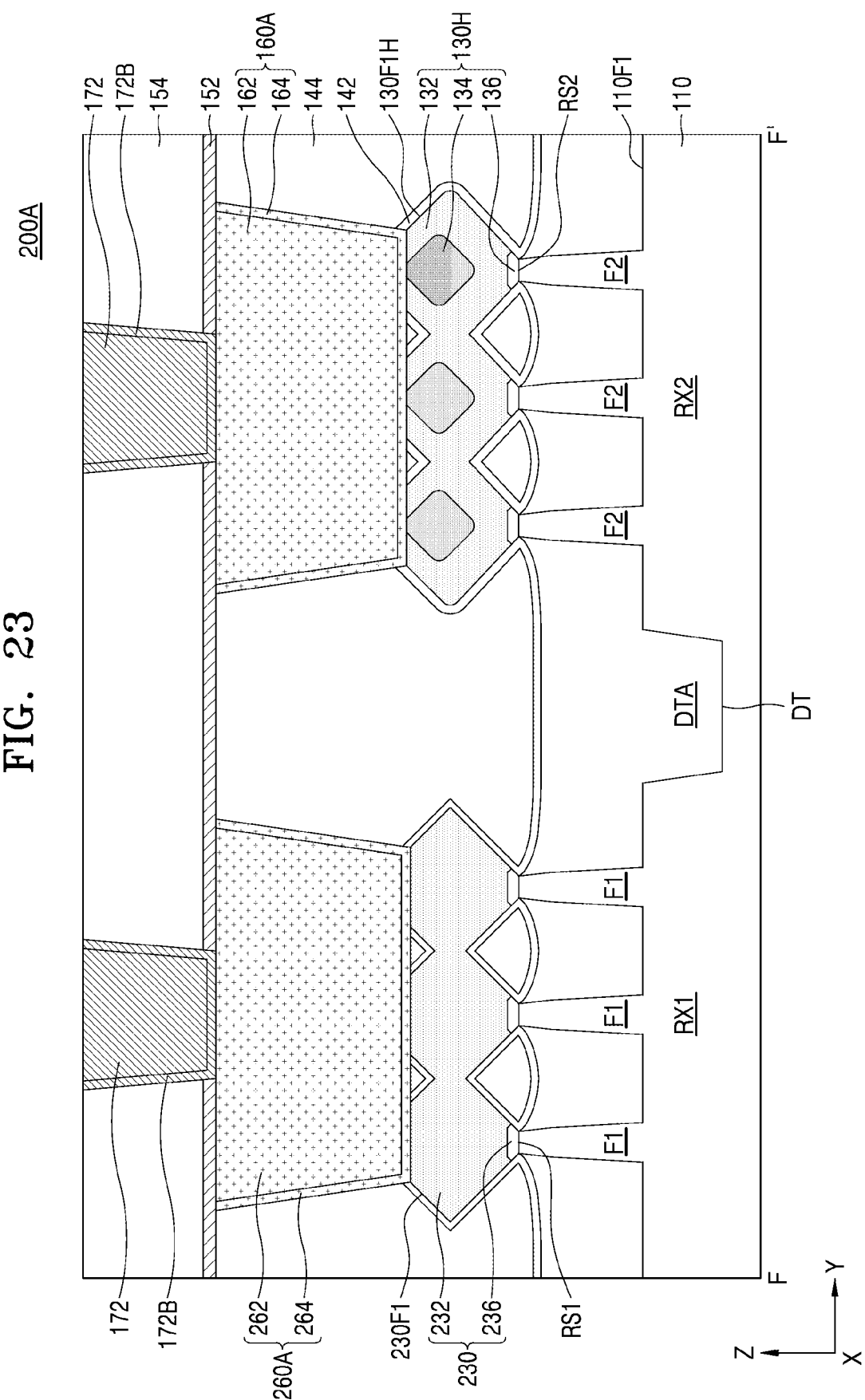

FIGS. 22 and 23 are cross-sectional views of an integrated circuit device 200A according to example embodiments. FIG. 22 is a cross-sectional view taken along lines D-D 'and E-E' in FIG. 19, and FIG. 23 is a cross-sectional view taken along a line F-F' in FIG. 19. In FIGS. 22 and 23, reference numerals that are the same as those in FIGS. 1 to 21 denote the same components.

Referring to FIGS. 22 and 23, a first contact plug 260A and a second contact plug 160A may have flat bottom surfaces along a second direction (Y direction). For example, the second contact plug 160A may have a bottom surface at a level lower than that of the top surface of a portion of the second source/drain regions 130H and contact the top surface of the gap-fill semiconductor layer 134. However, the inventive concepts are not limited thereto.

FIGS. 24 to 31 are cross-sectional views showing a method of manufacturing the integrated circuit device 100 according to example embodiments. In FIGS. 24 to 31, cross-sectional views corresponding to cross-sections taken along lines A-A' and B-B' in FIG. 1 are shown in the order of a manufacturing process. In FIGS. 24 to 31, reference numerals that are the same as those in FIGS. 1 to 13 denote the same components.

Figure 24:
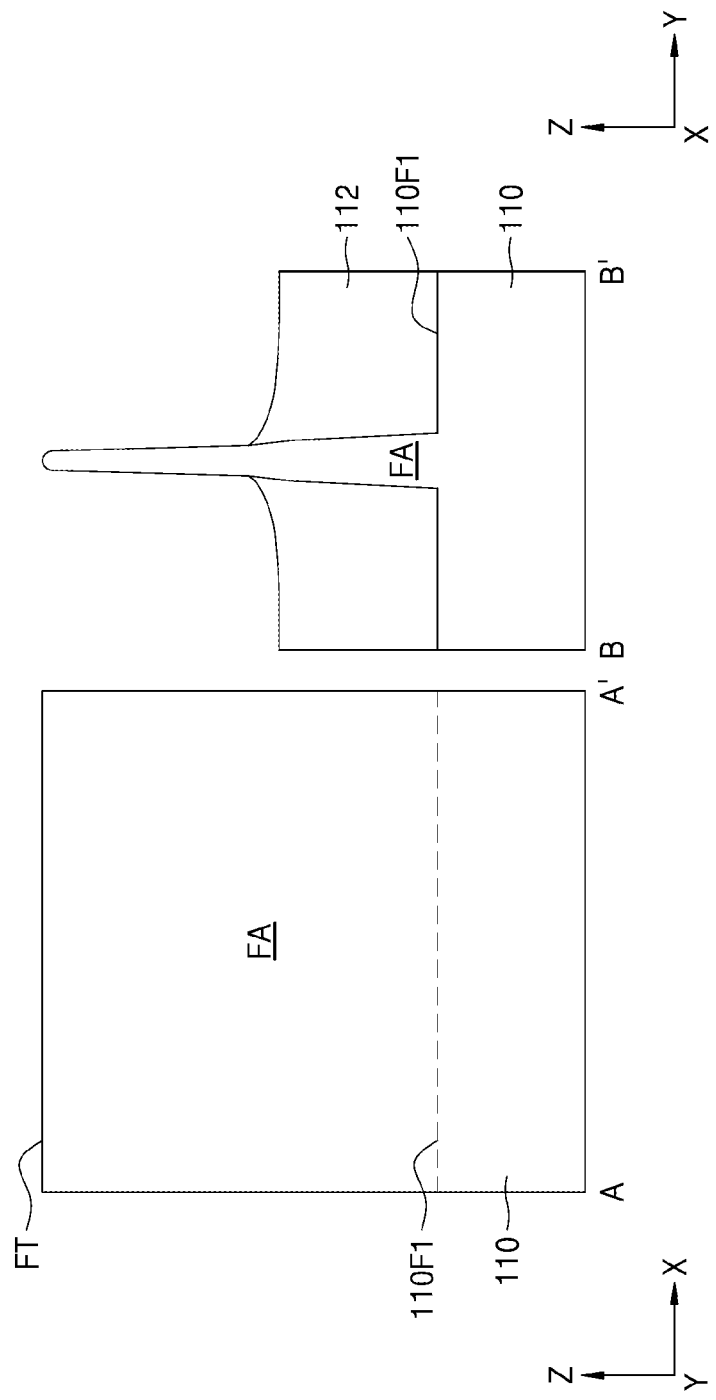
FIGS. 24 to 31 are cross-sectional views showing a method of manufacturing an integrated circuit device, according to example embodiments.

Referring to FIG. 24, a portion of the active region of the substrate 110 may be etched to form the fin-type active region FA protruding from the top surface 110F1 of the substrate 110 in a vertical direction and extending in the first direction (X direction).

The device isolation layer 112 may be formed on the substrate 110 to cover both sidewalls of the fin-type active region FA. Although not shown, an interfacial layer (not shown) conformally covering the sidewalls of the fin-type active region FA may be further formed between the device isolation layer 112 and the fin-type active region FA.

Figure 25:
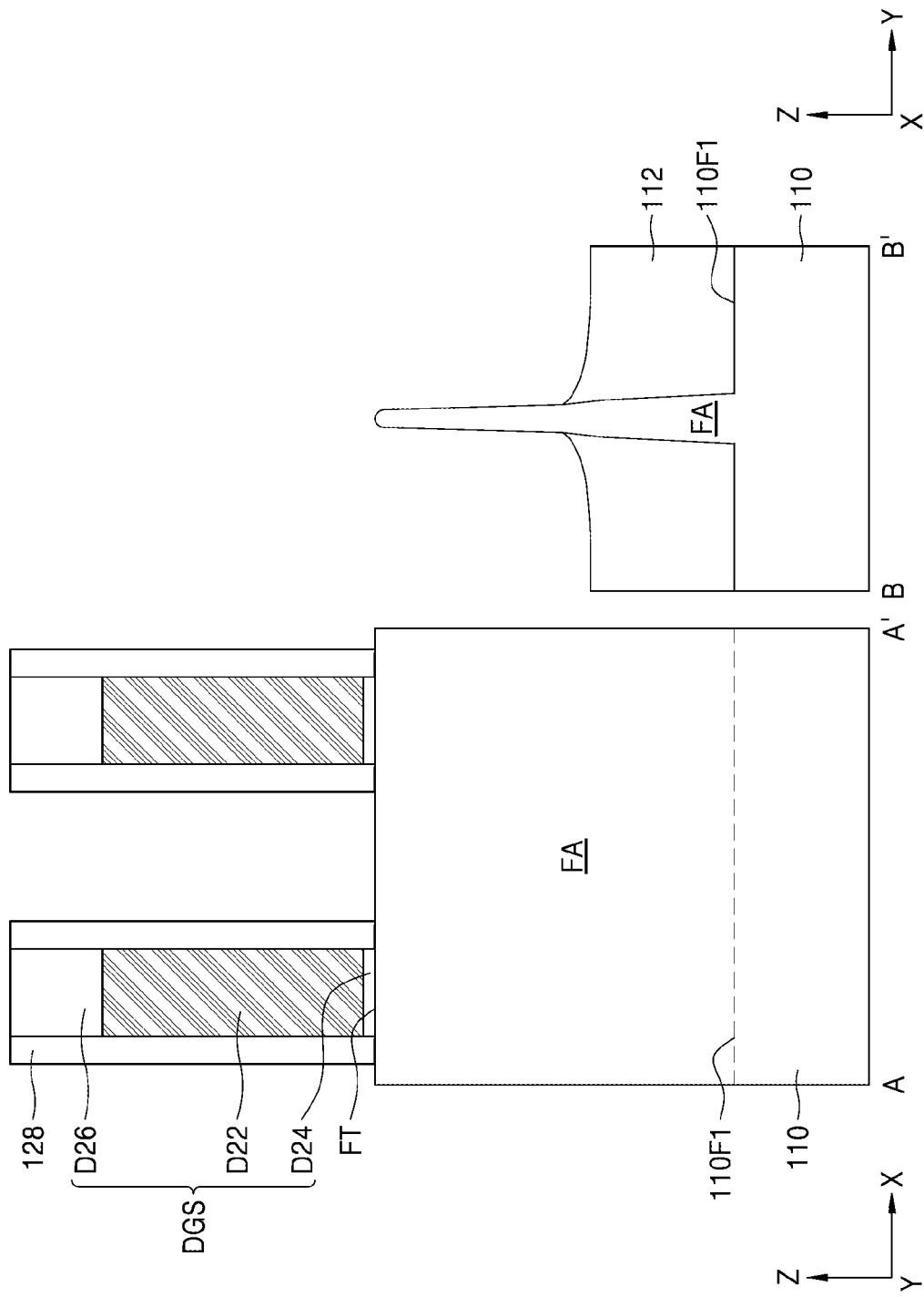

Referring to FIG. 25, a sacrificial gate structure DGS extending in the second direction is formed on the substrate 110. In example embodiments, a sacrificial gate insulation layer pattern D24, a sacrificial gate D22, and/or a hard mask pattern D26, which are stacked on the substrate 110, are formed. Next, an insulation layer (not shown) covering the hard mask pattern D26, the sacrificial gate D22, and the gate insulation layer pattern D24 is formed through an atomic layer deposition (ALD) process or a chemical vapor deposition (CVD) process, and an anisotropic etching process is performed on the insulation layer. As a result, the gate spacers 128 may be formed on the sidewalls of the hard mask pattern D26, the sacrificial gate D22, and the sacrificial gate insulation layer pattern D24. The gate spacer 128 may include, but is not limited to, silicon nitride.

Figure 26:
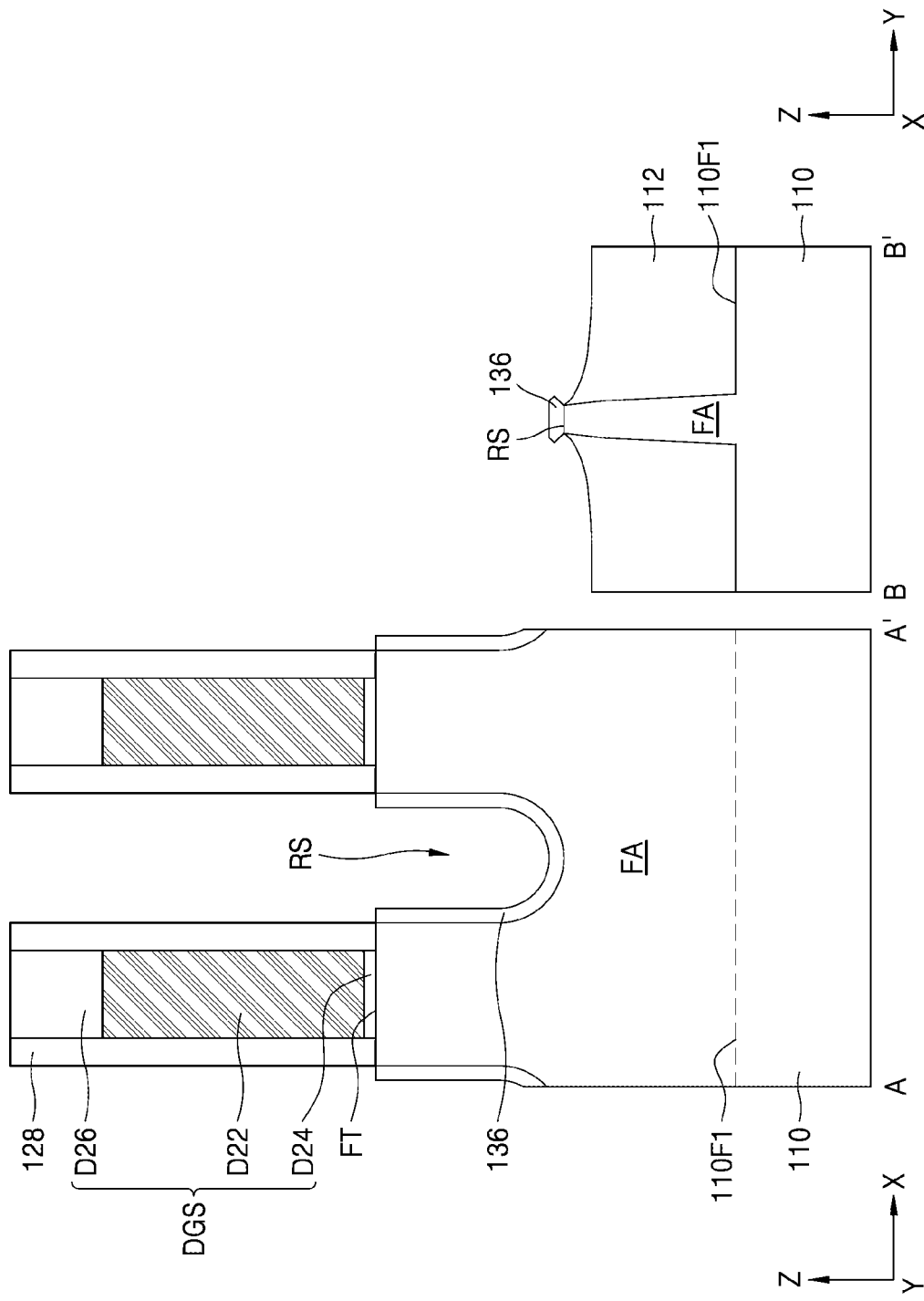

Referring to FIG. 26, a portion of a fin-type active region FA on both sides of the sacrificial gate structure DGS and the gate spacer 128 may be etched to form the recess region RS. In example embodiments, the process for forming the recess region RS may include a dry-etching process, a wet-etching process, or a combination thereof.

In the process for forming the recess region RS, a portion of the fin-type active region FA below the gate spacer 128 is further removed, and thus the recess region RS may extend in lateral directions and a portion of the recess region RS may vertically overlap the gate spacer 128. In this case, the integrated circuit devices 100D, 100E, 100F, and 100G described above with reference to FIGS. 13 to 18 may be obtained.

The lower semiconductor layer 136 may then be conformally formed on the inner wall of the recess region RS.

The lower semiconductor layer 136 may be formed through an epitaxy process using the sidewall of the fin-type active region FA exposed on the inner wall of the recess region RS and the top surface of the substrate 110 as a seed layer. The epitaxy process may be a CVD process such as vapor-phase epitaxy (VPE) and ultra-high vacuum chemical vapor deposition (UHV-CVD), molecular beam epitaxy, or a combination thereof. In the epitaxy process, the lower semiconductor layer 136 may be formed by using a liquid or gaseous precursor as a precursor for forming the lower semiconductor layer 136 at a process pressure from about 50 Torr to about 400 Torr.

In the epitaxy process for forming the lower semiconductor layer 136, the first impurity may be in-situ doped to the lower semiconductor layer 136. The lower semiconductor layer 136 may include the first impurity in the range from about 1E20 atoms/cm$^3$ to about 5E21 atoms/cm$^3$, but the inventive concepts are not limited thereto.

Figure 27:
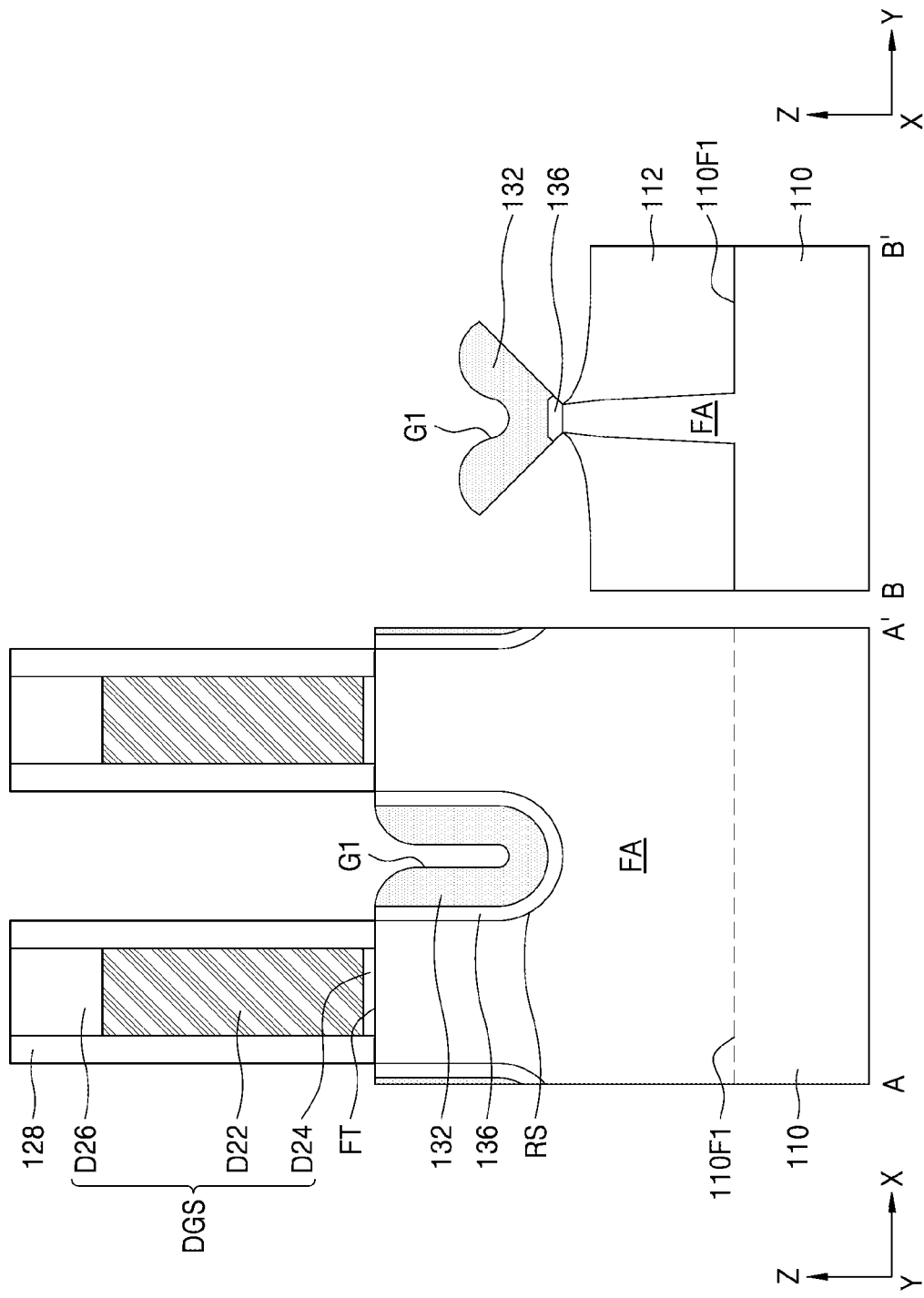
Figure 28:
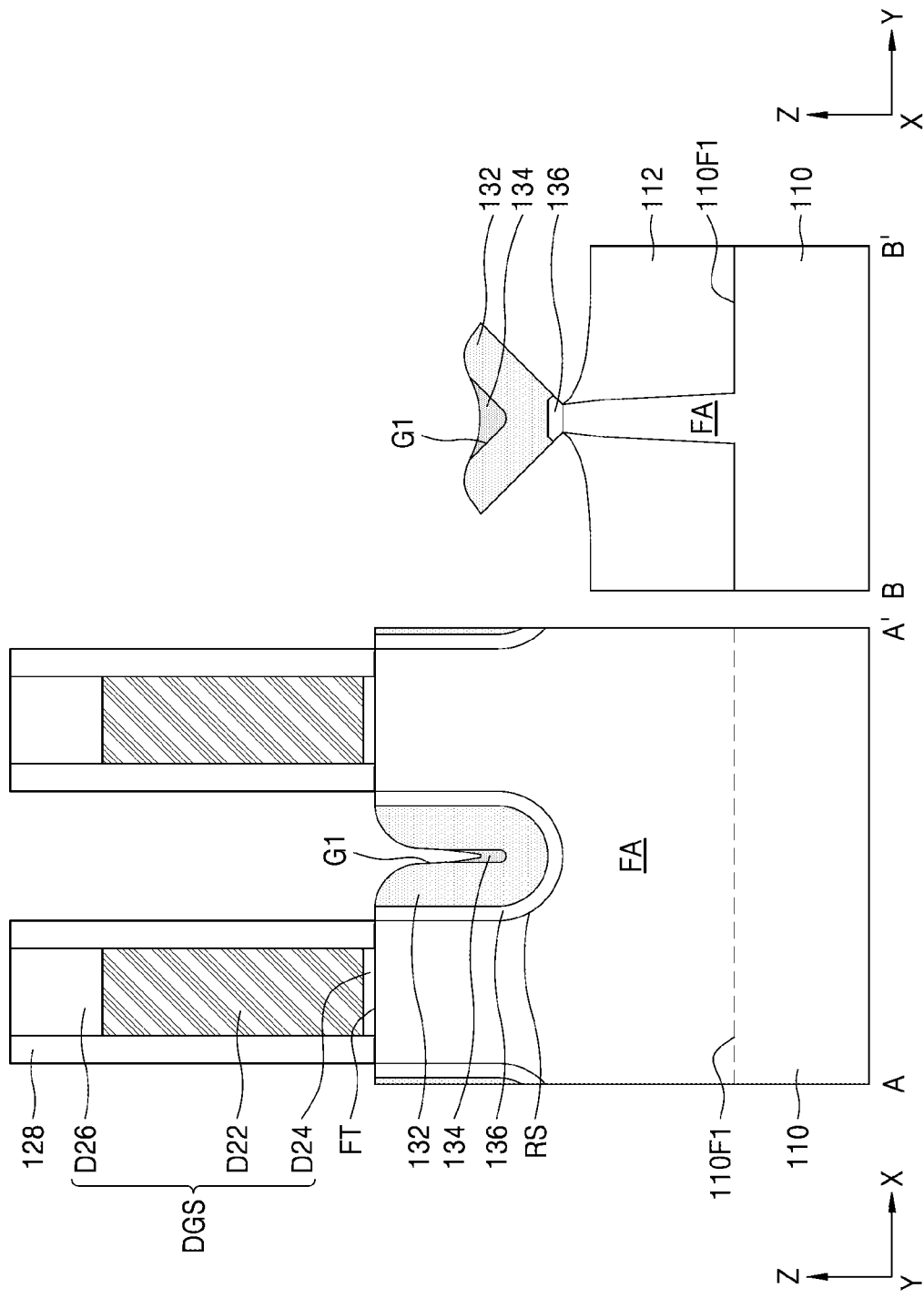
Figure 29:
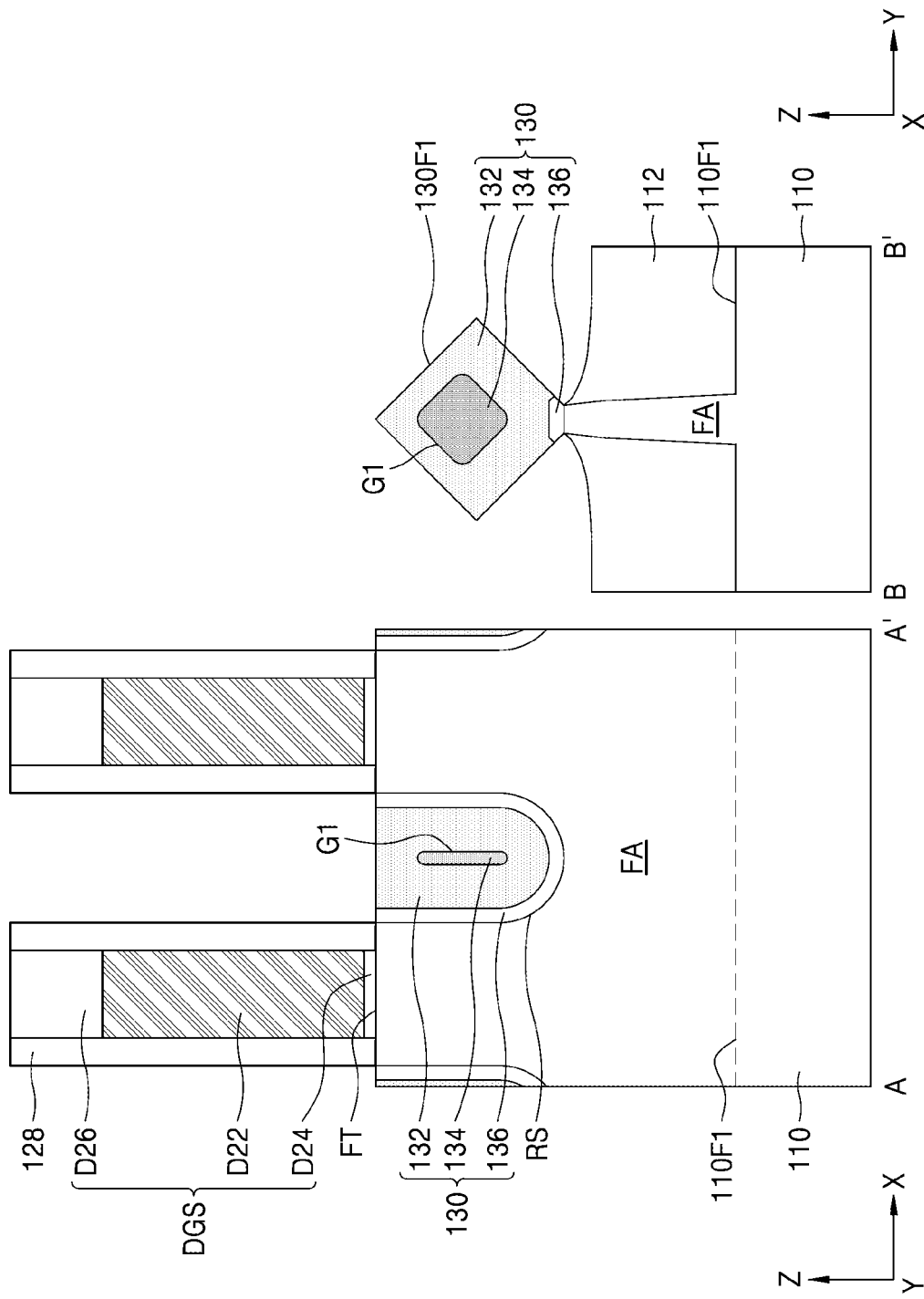

Referring to FIGS. 27 to 29, the upper semiconductor layer 132 and the gap-fill semiconductor layer 134 surrounded by the upper semiconductor layer 132 may be formed on the inner wall of the recess region RS.

FIG. 27 is a cross-sectional view showing a state in which a portion of the upper semiconductor layer 132 is formed on the inner wall of the recess region RS, FIG. 28 is a cross-sectional view showing a state in which the portion of the upper semiconductor layer 132 and a portion of the gap-fill semiconductor layer 134 are formed on the inner wall of the recess region RS, and FIG. 29 is a cross-sectional view showing a state in which the upper semiconductor layer 132 and the gap-fill semiconductor layer 134 are completely formed. FIGS. 27 and 28 are schematic views of intermediate stages of a manufacturing process for convenience of explanation, and shapes of the upper semiconductor layer 132 and the gap-fill semiconductor layer 134 in the intermediate stages of the manufacturing process are not limited to those shown in FIGS. 27 and 28.

Referring to FIG. 27, the upper semiconductor layer 132 may be formed through an epitaxy process using the top surface of the lower semiconductor layer 136 exposed on the inner wall of the recess region RS as a seed layer. The epitaxy process may be a CVD process like VPE and UHV-CVD, molecular beam epitaxy, or a combination thereof. In the epitaxy process, the upper semiconductor layer 132 may be formed at a process pressure from about 100 Torr to 400 Torr by using a liquid or gaseous precursor as a precursor for forming the upper semiconductor layer 132.

In the epitaxy process for forming the upper semiconductor layer 132, the first impurity may be in-situ doped to the upper semiconductor layer 132. The upper semiconductor layer 132 may include the first impurity in the range from about 1E20 atoms/cm$^3$ to about 1E22 atoms/cm$^3$, but the inventive concepts are not limited thereto.

In example embodiments, the process for forming the upper semiconductor layer 132 may be performed under process conditions that a growth rate in a horizontal direction (e.g., X direction) from the sidewalls RSS1 and RSS2 (refer to FIG. 5) toward the space inside the recess region RS is higher than the growth rate in a vertical direction (e.g., the Z direction) from the bottom portion RSB (refer to FIG. 5) of the recess region RS toward the space inside the recess region RS. For example, the process for forming the upper semiconductor layer 132 may be performed under the growth conditions in which the growth rate of the (110) plane of a silicon substrate is higher than the growth rate of the (001) plane of the silicon substrate. For example, the process for forming the upper semiconductor layer 132 may be performed at a process pressure from about 100 Torr to about 400 Torr.

As the upper semiconductor layer 132 is formed at a relatively high growth rate in a lateral direction or a horizontal direction, the gap G1 may be disposed in the center portion of the upper semiconductor layer 132. As shown in the left cross-sectional view along the line A-A' of FIG. 27, the gap G1 may have a cross-sectional shape that extends relatively long in the third direction (Z direction).

Referring to FIG. 28, as the upper semiconductor layer 132 is grown, the width of the gap G1 may be gradually reduced, and the gap-fill semiconductor layer 134 may be formed to fill the gap G1 from the bottom portion of the gap G1.

As the upper semiconductor layer 132 is formed at a relatively high growth rate in a lateral direction, the gap G1 having a relatively narrow width (e.g., the first width W11 (refer to FIG. 5)) and a relatively large height (e.g., the first height H11 (refer to FIG. 5)) may be formed in the center portion of the upper semiconductor layer 132. A liquid or gaseous precursor or a source material for forming the upper semiconductor layer 132 may be trapped or piled up within the gap G1, and vaporization of the precursor or the source material may be suppressed. A precursor of the first impurity or the source material may be condensed or solidified within the gap G1, and thus the gap-fill semiconductor layer 134 may be formed. The gap-fill semiconductor layer 134 may include the first impurity at the second impurity concentration, and the second impurity concentration may be greater than the first impurity concentration of the first impurity included in the upper semiconductor layer 132. For example, the second impurity concentration may be within the range from about 110% to about 150% of the first impurity concentration, but is not limited thereto.

Referring to FIG. 29, the upper semiconductor layer 132 may cover the top surface of the gap-fill semiconductor layer 134 and completely fill the interior of the recess region RS. The upper semiconductor layer 132 may be formed to have a top surface at a same level as the vertical level LV3 of the top surface FT of the fin-type active region FA (refer to FIG. 5). In other embodiments, the upper semiconductor layer 132 may be disposed to have a top surface at a level higher than the vertical level LV3 of the top surface FT of the fin-type active region FA.

The top surface and the cross-section of the upper semiconductor layer 132 may have various shapes depending on the type of a precursor or a source material used in the process for forming the upper semiconductor layer 132, the process pressure, the process temperature, the width and the height of the recess region RS, etc. For example, combinations of various process conditions may be used to form the integrated circuit devices 100D, 100E, 100F, and 100G described above with reference to FIGS. 13 to 18.

Figure 30:
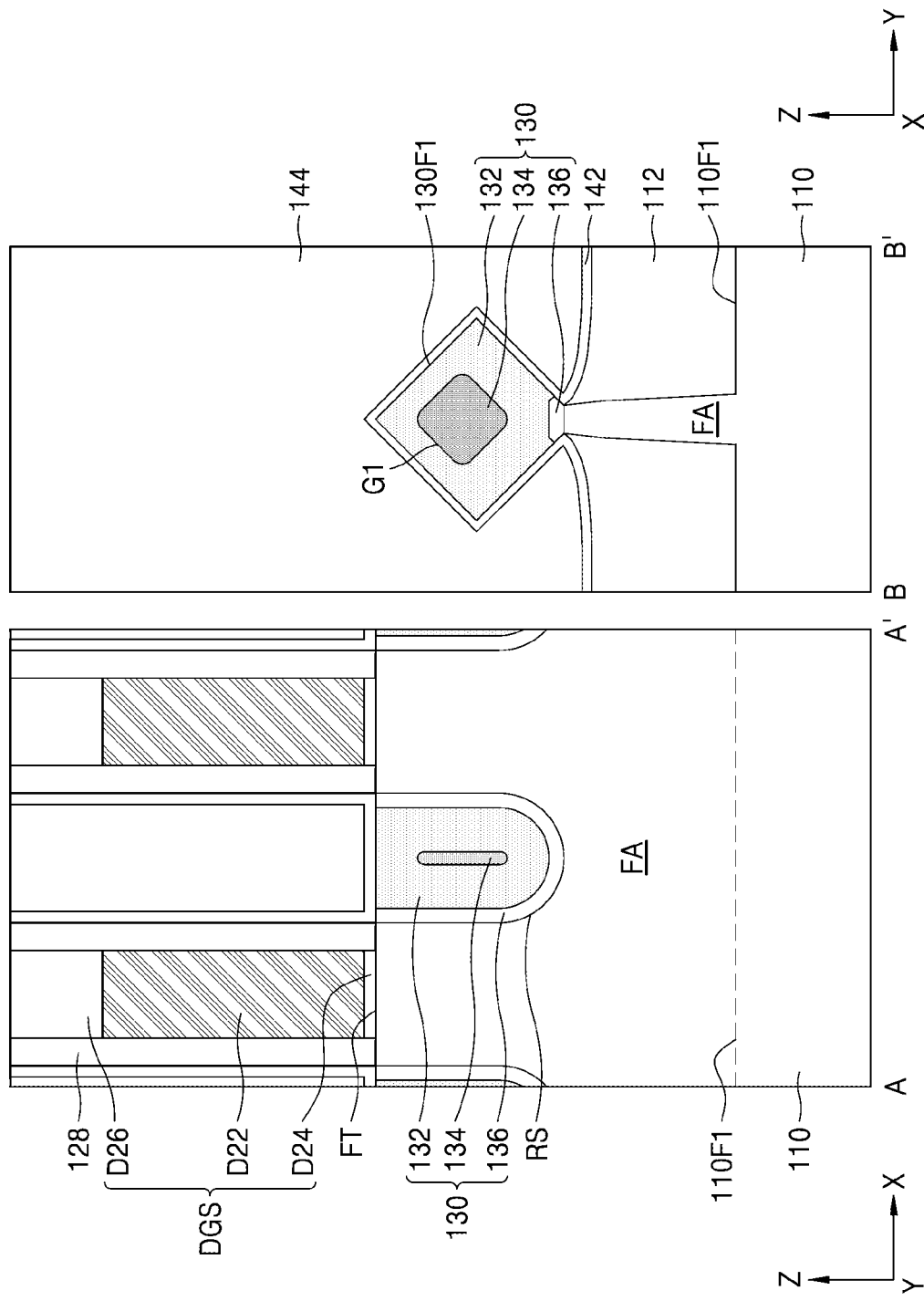

Referring to FIG. 30, the first etch stop layer 142 covering the sacrificial gate structure DGS and the source/drain regions 130 may be formed on the substrate 110. An insulation layer (not shown) may be formed on the first etch stop layer 142 and the insulation layer may be planarized so that the top surface of the hard mask pattern D26 is exposed, thereby forming the inter-gate insulation layer 144.

Figure 31:
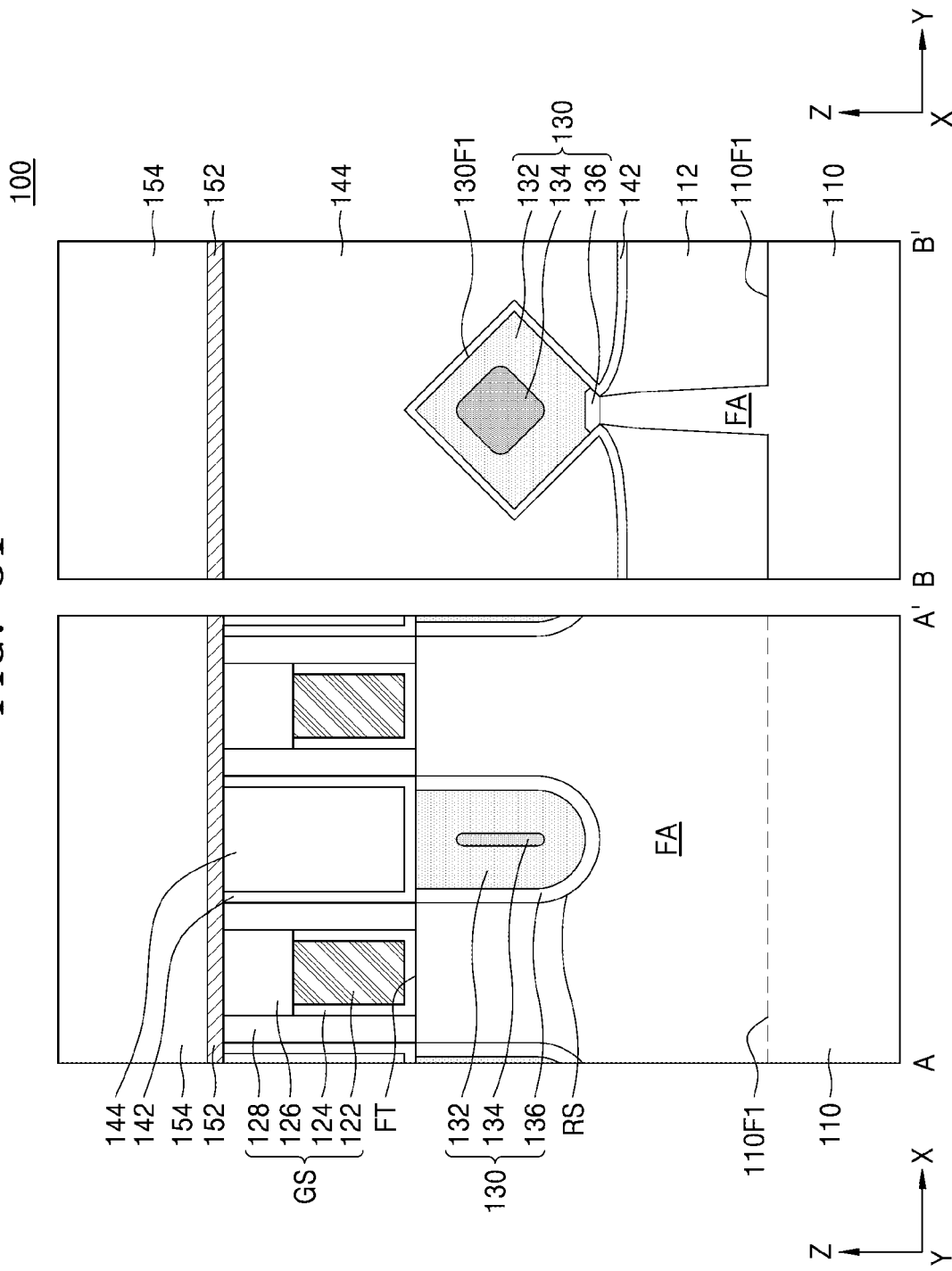

Referring to FIG. 31, after the hard mask pattern D26 (refer to FIG. 30), the sacrificial gate D22 (refer to FIG. 30), and the sacrificial gate insulation layer pattern D24 (refer to FIG. 30) are removed, the gate insulation layer 124 may be formed on the inner walls of a pair of gate spacers 128 and the fin-type active region FA. Thereafter, a conductive layer (not shown) filling a space between the pair of gate spacers 128 is formed on the gate insulation layer 124, and the gate electrode 122 may be disposed by etching back the upper portion of the conductive layer. Next, an insulation layer (not shown) filling the remaining space between the pair of gate spacers 128 is formed on the gate electrode 122 and the inter-gate insulation layer 144, and the upper portion of the insulation layer is removed so that the top surface of the inter-gate insulation layer 144 or the top surfaces of the pair of gate spacers 128 are exposed. As a result, the gate capping layer 126 may be formed. Accordingly, the gate structure GS including the gate electrode 122, the gate insulation layer 124, the gate capping layer 126, and the pair of gate spacers 128 may be formed.

In example embodiments, the process for removing the hard mask pattern D26, the sacrificial gate D22, and the sacrificial gate insulation layer pattern D24 may include a wet-etching process. For example, an etchant including $HNO_3$, diluted hydrofluoric acid (DHF), $NH_4OH$, tetramethyl ammonium hydroxide (TMAH), KOH, or a combination thereof may be used to perform the wet-etching.

Next, the second etch stop layer 152 and the first interlayer insulating film 154 may be formed on the gate structure GS and the inter-gate insulation layer 144. Although not shown, a contact hole (not shown) penetrating through the first interlayer insulating film 154 and the second etch stop layer 152 and exposing the top surface of the source/drain regions 130 may be formed, and a contact (not shown) connected to the source/drain regions 130 may be formed by filling the contact hole with a conductive material.

The integrated circuit device 100 is manufactured according to the above-described manufacturing method. According to the above-described manufacturing method, the gap-fill semiconductor layer 134 may be disposed in the gap G1 having a relatively narrow width by controlling process conditions during the process for forming the upper semiconductor layer 132. Therefore, the integrated circuit device 100 manufactured according to the above manufacturing method may exhibit improved electrical performance.

In the process described above with referent to FIG. 26, the upper semiconductor layer 132 may be formed by using the top surface of the fin-type active region FA exposed on the inner wall of the recess region RS as a seed layer instead of forming the lower semiconductor layer 136. In this case, the integrated circuit device 100A described above with reference to FIGS. 6 and 7 may be manufactured.

Also, in the process described above with reference to FIG. 27, the intermediate semiconductor layer 139 may be formed by using the top surface of the lower semiconductor layer 136 exposed on the inner wall of the recess region RS as a seed layer before the upper semiconductor layer 132 is formed. The intermediate semiconductor layer 139 may be formed under process conditions that the growth rate in a vertical direction is higher the growth rate in a lateral direction (e.g., a process condition that the growth rate of the (001) plane of a silicon substrate is higher than the growth rate of the (110) plane of the silicon substrate). In this case, the intermediate semiconductor layer 139 that preferentially fills the bottom portion RSB (refer to FIG. 12) of the recess region RS may be disposed, and thus the integrated circuit device 100C described above with reference to FIGS. 10 to 12 may be manufactured.

Also, the capping semiconductor layer 138 may be conformally formed on the top surface of the upper semiconductor layer 132 before the first etch stop layer 142 is formed in the process described above with reference to FIG. 30. In this case, the integrated circuit device 100B described above with reference to FIGS. 8 and 9 may be manufactured As described above, example embodiments have been disclosed in the drawings and specification. Although embodiments have been described herein using specific terminology, it is understood that they have been used only for purposes of describing the inventive concepts and not for limiting the scope of the inventive concepts as defined in the claims. Therefore, one of ordinary skill in the art will appreciate that various modifications and equivalent embodiments are possible without departing from the scope of the inventive concepts. Accordingly, the true scope of protection of the inventive concepts should be determined by the technical idea of the appended claims.

What is claimed is:

1. An integrated circuit device comprising:
    a fin-type active region extending on a substrate in a first direction parallel to a top surface of the substrate;
    a gate structure extending on the fin-type active region and extending in a second direction parallel to the top surface of the substrate and different from the first direction; and
    source/drain regions in a recess region extending from one side of the gate structure into the fin-type active region, the source/drain regions comprising:
    an upper semiconductor layer on an inner wall of the recess region, having a first impurity concentration, the upper semiconductor layer including a gap; and
    a gap-fill semiconductor layer, in the gap having a second impurity concentration greater than the first impurity concentration.

2. The integrated circuit device of claim 1, wherein the gap extends in a third direction perpendicular to the top surface of the substrate within a center portion of the upper semiconductor layer, and
    the gap-fill semiconductor layer extends in the third direction inside the gap.

3. The integrated circuit device of claim 1, wherein sidewalls of the gap-fill semiconductor layer are surrounded by the upper semiconductor layer.

4. The integrated circuit device of claim 1, wherein a top surface and a bottom surface of the gap-fill semiconductor layer are covered by the upper semiconductor layer.

5. The integrated circuit device of claim 1, wherein the gap-fill semiconductor layer has a first width in the first direction and a first height in a third direction perpendicular to the top surface of the substrate, wherein a ratio of the first height to the first width is between 2 and 10.

6. The integrated circuit device of claim 1, wherein a bottom surface of the gap-fill semiconductor layer is at a level higher than that of a bottom surface of the upper semiconductor layer.

7. The integrated circuit device of claim 1, wherein the upper semiconductor layer comprises a first impurity at a first impurity concentration in the range from about 1E20 atoms/cm$^3$ to about 1E22 atoms/cm$^3$, and the gap-fill semiconductor layer comprises the first impurity at a second impurity concentration from about 110% to about 150% of the first impurity concentration.

8. The integrated circuit device of claim 1, wherein the recess region comprises a first sidewall and a second sidewall apart from each other in the first direction, the gap-fill semiconductor layer comprises a first sidewall facing the first sidewall of the recess region and a second sidewall facing the second sidewall of the recess region, and a first distance in the first direction from the first sidewall of the recess region to the first sidewall of the gap-fill semiconductor layer is substantially identical to a second distance in the first direction from the second sidewall of the recess region to the second sidewall of the gap-fill semiconductor layer.

9. The integrated circuit device of claim 1, wherein the source/drain regions further comprise a lower semiconductor layer between the upper semiconductor layer and the fin-type active region on the inner wall of the recess region, and the lower semiconductor layer has a third impurity concentration less than the first impurity concentration.

10. The integrated circuit device of claim 1, wherein the source/drain regions further comprise a capping semiconductor layer on a top surface of the upper semiconductor layer and having a fourth impurity concentration smaller than the first impurity concentration.

11. The integrated circuit device of claim 1, wherein the recess region includes a first sidewall and a second sidewall apart from each other in the first direction and a bottom portion connected to the first sidewall and the second sidewall, and the source/drain regions comprise:
a lower semiconductor layer on the first sidewall, the second sidewall, and the bottom portion of the recess region; and
an intermediate semiconductor layer between the upper semiconductor layer and the lower semiconductor layer on the bottom portion of the recess region and having a fifth impurity concentration smaller than the first impurity concentration.

12. The integrated circuit device of claim 11, wherein an upper sidewall of the upper semiconductor layer contacts the lower semiconductor layer and a lower sidewall and a bottom portion of the upper semiconductor layer contact the intermediate semiconductor layer.

13. The integrated circuit device of claim 1, wherein the gap-fill semiconductor layer vertically overlaps a center line of the recess region that bisects the recess region in the first direction.

14. An integrated circuit device comprising:
a fin-type active region extending on a substrate in a first direction parallel to a top surface of the substrate;
first and second gate structures extending on the fin-type active region and extending in a second direction parallel to the top surface of the substrate and different from the first direction; and
source/drain regions in a recess region extending into the fin-type active region between the first and second gate structures, the source/drain regions comprising:

an upper semiconductor layer on an inner wall of the recess region, having a first impurity concentration, the upper semiconductor layer including a gap extending in a third direction perpendicular to the top surface of the substrate; and
a gap-fill semiconductor layer, in the gap having a second impurity concentration greater than the first impurity concentration.

15. The integrated circuit device of claim 14, wherein the gap is in a center portion of the upper semiconductor layer, and the gap-fill semiconductor layer overlaps a center line of the recess region that bisects the recess region in the first direction.

16. The integrated circuit device of claim 14, wherein the gap-fill semiconductor layer extends in the third direction inside the gap, a bottom surface of the gap-fill semiconductor layer is at a level higher than that of a bottom surface of the upper semiconductor layer, and a top surface of the gap-fill semiconductor layer is covered by the upper semiconductor layer.

17. The integrated circuit device of claim 14, wherein the upper semiconductor layer comprises a first impurity at a first impurity concentration in the range from about 1E20 atoms/cm$^3$ to about 1E22 atoms/cm$^3$, and the gap-fill semiconductor layer comprises the first impurity at a second impurity concentration from about 110% to about 150% of the first impurity concentration.

18. An integrated circuit device comprising:
a fin-type active region extending on a substrate in a first direction parallel to a top surface of the substrate;
a plurality of gate structures extending on the fin-type active region and extending in a second direction parallel to the top surface of the substrate and different from the first direction; and
source/drain regions in a recess region extending into the fin-type active region between two neighboring gate structures, the source/drain regions comprising:
an upper semiconductor layer on an inner wall of the recess region, the upper semiconductor layer including a gap, and
a gap-fill semiconductor layer in the gap,
wherein a top surface of the gap-fill semiconductor layer is covered by the upper semiconductor layer.

19. The integrated circuit device of claim 18, wherein the recess region comprises a first sidewall and a second sidewall apart from each other in the first direction, the gap-fill semiconductor layer comprises a first sidewall facing the first sidewall of the recess region and a second sidewall facing the second sidewall of the recess region, and a first distance in the first direction from the first sidewall of the recess region to the first sidewall of the gap-fill semiconductor layer is substantially identical to a second distance in the first direction from the second sidewall of the recess region to the second sidewall of the gap-fill semiconductor layer.

20. The integrated circuit device of claim 18, wherein the gap-fill semiconductor layer vertically overlaps a center line of the recess region that bisects the recess region in the first direction, and the top surface of the gap-fill semiconductor layer is at a level lower than that of a top surface of the upper semiconductor layer.

* * * * *